US011107859B2

(12) United States Patent
Chiang et al.

(10) Patent No.: US 11,107,859 B2
(45) Date of Patent: Aug. 31, 2021

(54) MEMORY CELL WITH UNIPOLAR SELECTORS

(71) Applicant: Taiwan Semiconductor Manufacturing Co., Ltd., Hsin-Chu (TW)

(72) Inventors: Katherine H. Chiang, New Taipei (TW); Chung-Te Lin, Tainan (TW); Mauricio Manfrini, Leuven (BE)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/531,482

(22) Filed: Aug. 5, 2019

(65) Prior Publication Data

US 2021/0043683 A1    Feb. 11, 2021

(51) Int. Cl.
*G11C 11/16*  (2006.01)
*H01L 27/22*  (2006.01)
*H01L 43/12*  (2006.01)
*H01L 43/02*  (2006.01)

(52) U.S. Cl.
CPC .......... *H01L 27/224* (2013.01); *G11C 11/161* (2013.01); *G11C 11/1657* (2013.01); *G11C 11/1659* (2013.01); *G11C 11/1675* (2013.01); *H01L 43/02* (2013.01); *H01L 43/12* (2013.01)

(58) Field of Classification Search
CPC .................................................. G11C 11/16
USPC ........................................................ 365/66
See application file for complete search history.

(56) References Cited

U.S. PATENT DOCUMENTS

| 6,130,814 | A  | 10/2000 | Sun |
| 6,256,223 | B1 | 7/2001  | Sun |
| 7,035,141 | B1 | 4/2006  | Tripsas |
| 7,683,433 | B2 | 3/2010  | Kapoor |
| 9,305,644 | B2 | 4/2016  | Kellam |
| 9,818,478 | B2 | 11/2017 | Chung |
| 9,859,333 | B2 | 1/2018  | Kim et al. |

(Continued)

FOREIGN PATENT DOCUMENTS

| JP | 2015035653 A  | 2/2015 |
| KR | 20110035456 A | 4/2011 |

OTHER PUBLICATIONS

Final Office Action dated Sep. 17, 2020 in connection with U.S. Appl. No. 16/411,706.

(Continued)

*Primary Examiner* — Jason Lappas
(74) *Attorney, Agent, or Firm* — Eschweiler & Potashnik, LLC

(57) ABSTRACT

In some embodiments, the present disclosure relates to an integrated circuit. The integrated circuit has a magnetic tunnel junction (MTJ) device disposed within a dielectric structure over a substrate. The MTJ device has a MTJ disposed between a first electrode and a second electrode. A first unipolar selector is disposed within the dielectric structure and is coupled to the first electrode. The first unipolar selector is configured to allow current to flow through the MTJ device along a first direction. A second unipolar selector is disposed within the dielectric structure and is coupled to the first electrode. The second unipolar selector is configured to allow current to flow through the MTJ device along a second direction opposite the first direction.

20 Claims, 15 Drawing Sheets

(56) References Cited

U.S. PATENT DOCUMENTS

| | | |
|---|---|---|
| 9,923,027 B2 | 3/2018 | Chiu et al. |
| 9,934,851 B2 | 4/2018 | Kellam |
| 10,249,379 B2 | 4/2019 | Chung |
| 2009/0180310 A1 | 7/2009 | Shimomura et al. |
| 2012/0044736 A1* | 2/2012 | Chung .................... G11C 8/14 365/66 |
| 2012/0044747 A1 | 2/2012 | Chung |
| 2012/0063192 A1 | 3/2012 | Lee |
| 2012/0075906 A1 | 3/2012 | Ho et al. |
| 2018/0174650 A1 | 6/2018 | Chung |

OTHER PUBLICATIONS

Notice of Allowance dated Dec. 18, 2020 in connection with U.S. Appl. No. 16/411,706.
Non-Final Office Action dated Apr. 7, 2020 in connection with U.S. Appl. No. 16/411,706.
Yang et al. "Threshold Switching Selector and 1S1R Integration Development for 3D Cross-point STT-MRAM." IEEE Memory Technology Session, published Dec. 6, 2017.
U.S. Appl. No. 16/411,706, filed May 14, 2019.

* cited by examiner

414 ↘

| | $WL_1$ | $BL_1$ | $WL_2$ | $WL_3$ and $WL_5$ | $WL_4$ and $WL_6$ | $BL_2$-$BL_4$ |
|---|---|---|---|---|---|---|
| HRS write | $V_{DD}$ | GND | $V_{DD}$ | Float | $V_{DD}$-$2\Delta V$ | $V_{DD}$-$\Delta V$ |
| LRS write | GND | $V_{DD}$ | GND | Float | $V_{DD}$-$\Delta V$ | Float |
| Readout | GND | $V_{READ}$ | GND | Float | Float | Float |

← 416
← 418
← 420

MEMORY CELL WITH UNIPOLAR SELECTORS

BACKGROUND

Many modern day electronic devices contain electronic memory configured to store data. Electronic memory may be volatile memory or non-volatile memory. Volatile memory stores data when it is powered, while non-volatile memory is able to store data when power is removed. Magneto-resistive random-access memory (MRAM) is one promising candidate for a next generation non-volatile memory technology.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
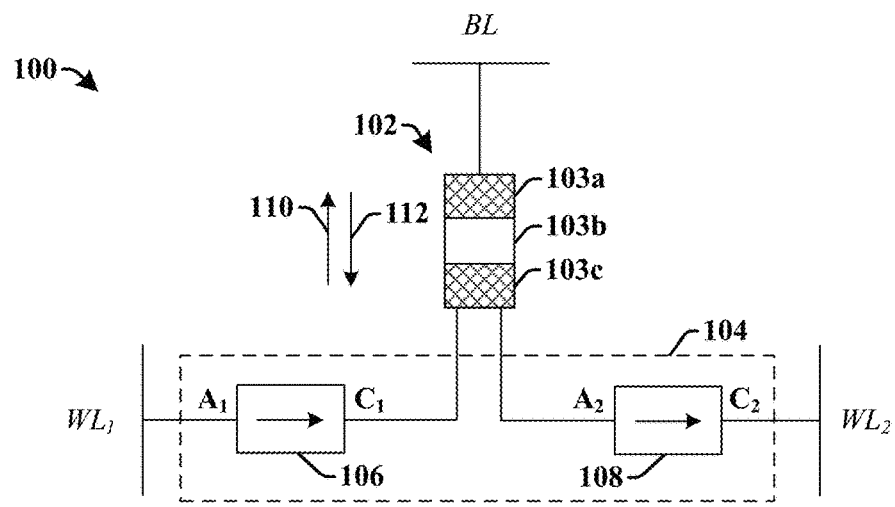
FIG. 1 illustrates a schematic diagram of some embodiments of a memory circuit having an access apparatus comprising a plurality of unipolar selectors configured to collectively provide access to a magnetic tunnel junction (MTJ) device.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Magnetic tunnel junction (MTJ) devices comprise an MTJ vertically arranged between conductive electrodes. The MTJ comprises a pinned layer separated from a free layer by a tunnel barrier layer. The magnetic orientation of the pinned layer is static (i.e., fixed), while the magnetic orientation of the free layer is capable of switching between a parallel configuration and an anti-parallel configuration with respect to that of the pinned layer. The parallel configuration provides for a low resistive state that digitally stores data as a first data state (e.g., a logical "1"). The anti-parallel configuration provides for a high resistive state that digitally stores data as a second data state (e.g., a logical "0").

Typically, MTJ devices are arranged within a memory array in rows and columns. A read or write operation is performed on an MTJ device within the memory array by activating word lines and bit lines to operate an access apparatus that selectively provides a voltage and/or current to the MTJ device. To achieve different data states, the access apparatus is typically a bipolar selector that allows for current to travel in opposing directions. This is because a MTJ device switches between high and low resistive states depending on a direction of an applied current. For example, a current traveling from a bottom electrode to a top electrode may give an MTJ device a high resistive state, while a current traveling from the top electrode to the bottom electrode may give the MTJ device a low resistive state.

One type of bipolar selector that is often used as an access apparatus for MTJ devices is a MOSFET transistor. While a MOSFET transistor offers good performance, the relatively high voltage and/or current that is used during write operations of an MTJ device can cause a size of the MOSFET transistor to be relatively large compared to MTJ devices. The large size of the MOSFET transistor limits how small memory cells within a memory array can be shrunk. Other types of bipolar selectors (e.g., stacked film selectors) can alternatively be used as an access apparatus for MTJ devices. However, while other types of bipolar selectors can be made to have a smaller size, such bipolar selectors fail to maintain the speed and/or endurance advantages that MTJ devices provide over other memory types (e.g., DRAM and/or SRAM).

The present disclosure, in some embodiments, relates to an integrated chip comprising a memory cell having a magnetic tunnel junction (MTJ) device and an access apparatus comprising a plurality of unipolar selectors (i.e., devices that respectively pass current along a single direction during normal operation). Because the access apparatus comprises a plurality of unipolar selectors, it is able to pass current through the MTJ device along opposing directions, thereby enabling data to be written and read from the MTJ device. Furthermore, the unipolar selectors are able to be formed at a smaller size than an access transistor and at a higher quality than other types of bipolar selectors. Accordingly, the resulting memory cell is able to have relatively small size (e.g., between approximately 1 to 5 times an area of an MTJ) and good performance (e.g., high endurance and low access speed).

FIG. 1 illustrates a schematic diagram of some embodiments of a memory cell 100 having an access apparatus comprising a plurality of unipolar selectors configured to collectively provide access to a magnetic tunnel junction (MTJ) device.

The memory cell 100 comprises a MTJ device 102 having a data storage layer 103b disposed between a first electrode 103a and a second electrode 103c. The first electrode 103a is coupled to a bit-line BL and the second electrode 103c is coupled to an access apparatus 104 configured to selectively provide access (e.g., read access and/or write access) to the MTJ device 102. The access apparatus 104 is further coupled to a first word line $WL_1$ and a second word line $WL_2$. The MTJ device 102 is configured to store data based upon its resistance. For example, the MTJ device 102 is configured to either store a first data state (e.g., a logical "1") if the MTJ device 102 is in a low resistive state or a second data state (e.g., a logical "0") if the MTJ device 102 is in a high resistive state having a higher resistance value than the low resistive state.

The access apparatus 104 comprises a first unipolar selector 106 and a second unipolar selector 108. The first unipolar selector 106 and the second unipolar selector 108 respectively comprise an anode terminal (an electrode that positive current flows into) and a cathode terminal (an electrode that positive current flows out of). In some embodiments, a first cathode $C_1$ of the first unipolar selector 106 and a second anode $A_2$ of the second unipolar selector 108 are coupled to the second electrode 103c of the MTJ device 102. In such embodiments, a first anode $A_1$ of the first unipolar selector 106 is further coupled to the first word line $WL_1$ and a second cathode $C_2$ of the second unipolar selector 108 is further coupled to the second word line $WL_2$.

In some embodiments, the first unipolar selector 106 and the second unipolar selector 108 may comprise diodes (e.g., PN diodes, PiN diodes, Schottky diodes, oxide semiconductor-oxide diodes, or the like). In such embodiments, an applied signal used to access (e.g., read and/or write to) the MTJ device 102 is greater than a threshold value of the diodes. In other embodiments, the first unipolar selector 106 and the second unipolar selector 108 may comprise filament based selectors, rectifiers, varistor-type selectors, ovonic threshold switches (OTSs), doped-chalcogenide-based selectors, Mott effect based selectors, mixed-ionic-electronic-conductive (MIEC)-based selectors, field-assisted-superliner-threshold (FAST) selectors, or the like. In some embodiments, the first unipolar selector 106 and the second unipolar selector 108 may be a same type of unipolar selector. In other embodiments, the first unipolar selector 106 and the second unipolar selector 108 may be different types of unipolar selectors. For example, in some embodiments, the first unipolar selector 106 may be a diode and the second unipolar selector may be a filament based selector.

During operation, the first unipolar selector 106 and the second unipolar selector 108 are respectively configured to allow current to pass along a single direction during normal operation (e.g., outside of breakdown). For example, the first unipolar selector 106 is configured to allow current to pass through the MTJ device 102 along the first direction 110 (e.g., from the first word line $WL_1$ to the bit line BL) and the second unipolar selector 108 is configured to allow current to pass through the MTJ device 102 along a second direction 112 that is opposite the first direction 110 (e.g., from the bit line BL to the second word line $WL_2$). When current passes through the MTJ device 102 along the first direction 110, a first data state (e.g., a logical "0") may be written to the MTJ device 102. When current passes through the MTJ device 102 along the second direction 112, a second data state (e.g., a logical "1") may be written to the MTJ device 102.

Therefore, by having the access apparatus 104 use the first unipolar selector 106 and the second unipolar selector 108 to collectively control access to the MTJ device 102, a flow of current through the MTJ device 102 can be selectively controlled along both the first direction 110 and the second direction 112. Furthermore, the use of unipolar selectors within an access apparatus offers a number of advantages over other types of access apparatus. For example, because the first unipolar selector 106 and the second unipolar selector 108 can have a relatively small size (e.g., approximately equal to 1 to 5 times the size of the MTJ), a size of a memory cell 100 can be made to be relatively small (e.g., less than 50 nm). Moreover, the large variety of available unipolar selectors and the ability to use different unipolar selectors allows for the access apparatus 104 to be formed with a high design flexibility, good resistance to voltage variations (e.g., due to high threshold voltages in reverse bias direction), as well as a good endurance, operation voltage, current density, and speed. Furthermore, using unipolar selectors allows for a biasing scheme of a memory array to be limited to a single polarity of bias voltages, thereby allowing for simplification of power rails servicing the memory array (e.g., a memory array can be serviced by power rails having positive voltages and without power rails having negative voltages).

Figure 2A:
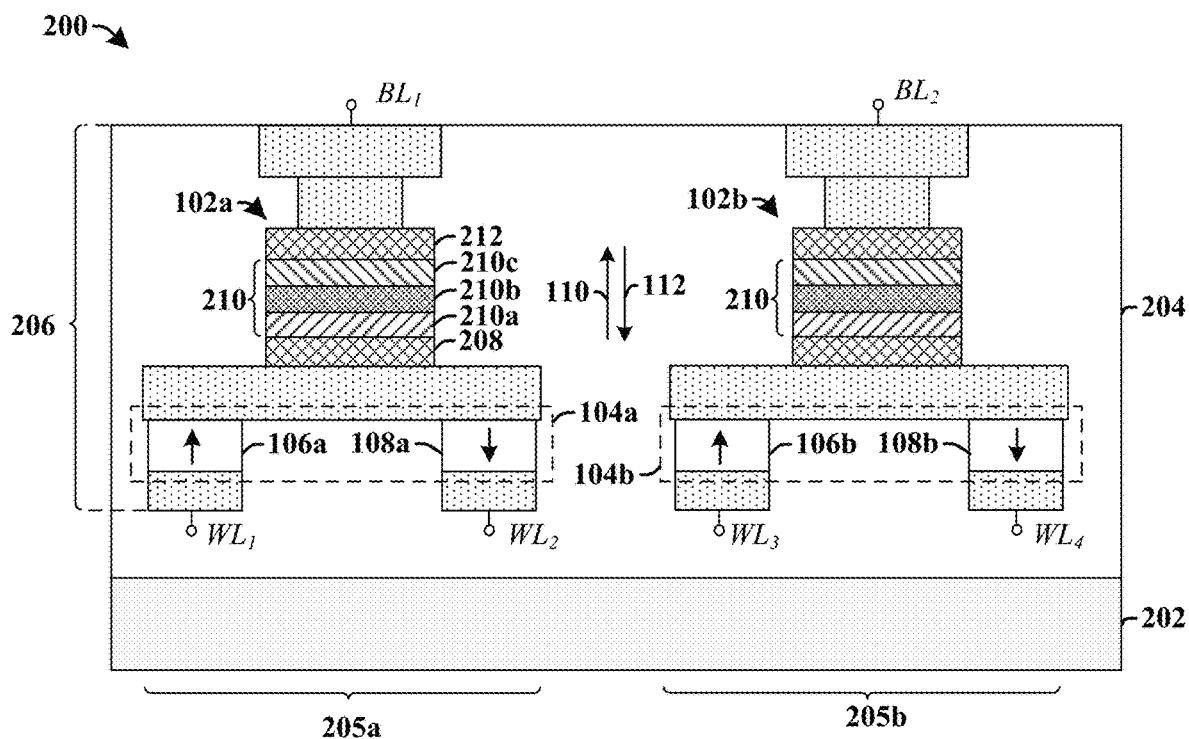
FIGS. 2A-2C illustrate cross-sectional views of some embodiments of integrated circuits having a memory cell including an access apparatus comprising a plurality of unipolar selectors.
Figure 2B:
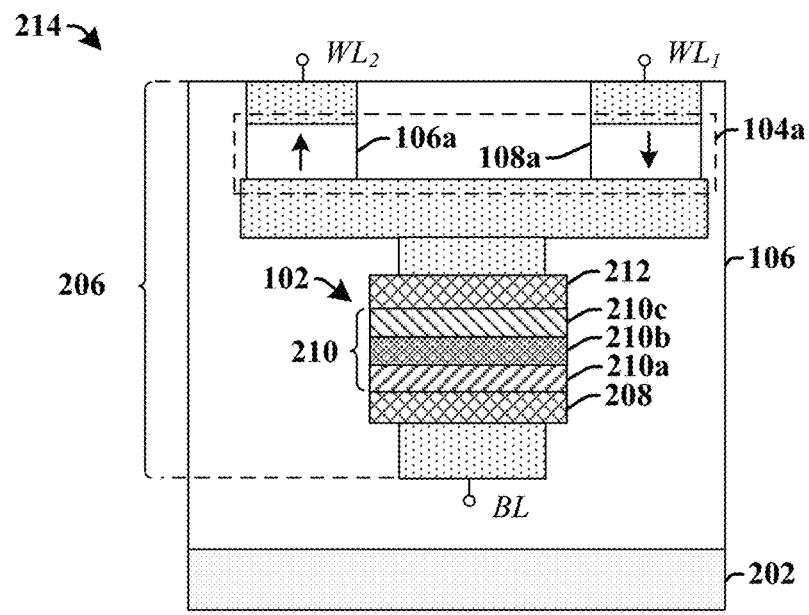
Figure 2C:
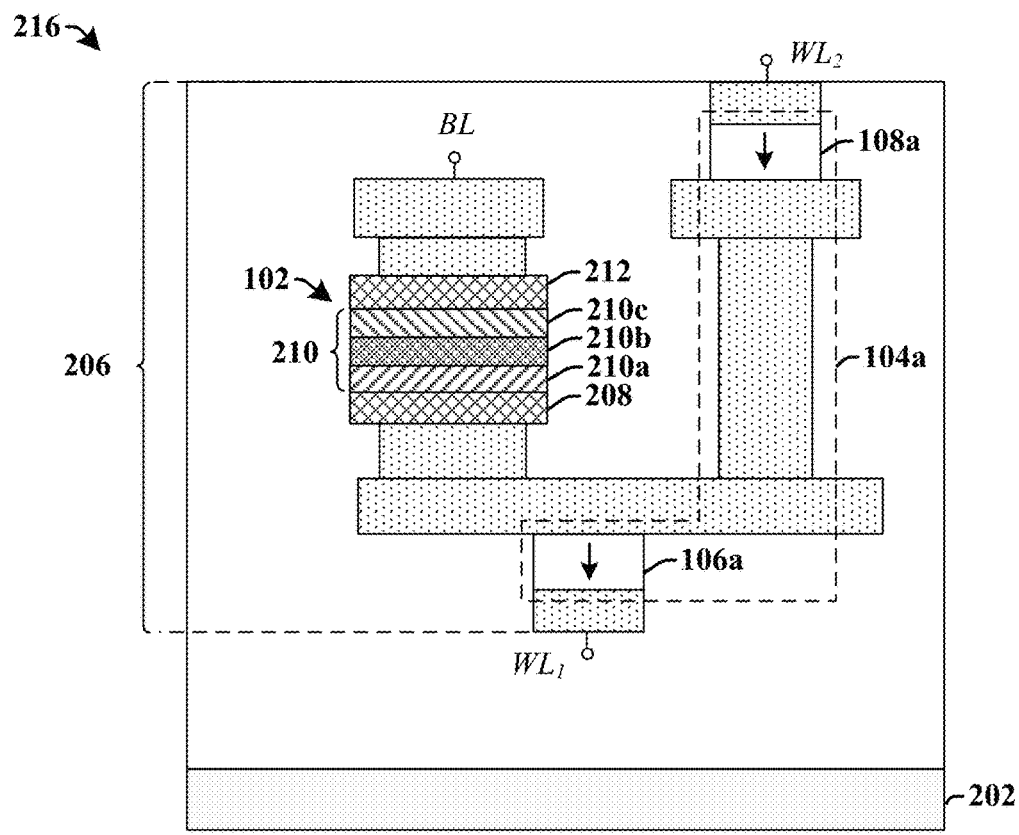

FIGS. 2A-2C illustrate cross-sectional views, 200, 214, and 216, of some embodiments of integrated chips having a memory cell including an access apparatus comprising a plurality of unipolar selectors.

FIG. 2A illustrates a cross-sectional view 200 of some embodiments of an integrated chip comprising a dielectric structure 204 arranged over a substrate 202. The dielectric structure 204 comprises a plurality of stacked inter-level dielectric (ILD) layers and surrounds a first memory cell 205a and a second memory cell 205b, which is laterally adjacent to the first memory cell 205a. The first memory cell 205a comprises a first magnetic tunnel junction (MTJ) device 102a configured to store a first data state. The second memory cell 205b comprises a second MTJ device 102b configured to store a second data state. The first MTJ device 102a and the second MTJ device 102b respectively comprise an MTJ 210 disposed between a bottom electrode 208 and a top electrode 212. In some embodiments, the MTJ 210 comprises a pinned layer 210a separated from a free layer 210c by a dielectric tunnel barrier 210b. The pinned layer 210a has a magnetization that is fixed, while the free layer 210c has a magnetization that can be changed during operation (through the tunnel magnetoresistance (TMR) effect) to be either parallel (i.e., a 'P' state) or anti-parallel (i.e., an 'AP' state) with respect to the magnetization of the pinned layer 210a. A relationship between the magnetizations of the pinned layer 210a and the free layer 210c define a resistive state of the MTJ 210 and thereby enables the MTJ 210 to store a data state.

In some embodiments, the pinned layer 210a may comprise cobalt (Co), iron (Fe), boron (B), nickel (Ni), ruthenium (Ru), iridium (Ir), platinum (Pt), or the like. In some embodiments, the dielectric tunnel barrier 210b may comprise magnesium oxide (MgO), aluminum oxide ($Al_2O_3$), or the like. In some embodiments, the free layer 210c may comprise cobalt (Co), iron (Fe), boron (B), or the like. In some embodiments, the bottom electrode 208 and the top electrode 212 may comprise one or more of titanium, tantalum, tungsten, titanium nitride, tantalum nitride, or the like.

The dielectric structure 204 further surrounds a plurality of conductive interconnect layers 206. The plurality of conductive interconnect layers 206 are configured to couple the first MTJ device 102a to a first access apparatus 104a and the second MTJ device 102b to a second access apparatus 104b. In various embodiments, the plurality of conductive interconnect layers 206 may comprise conductive interconnect wires and conductive interconnect vias. The conductive interconnect wires and the conductive interconnect vias comprise a conductive material (e.g., copper, aluminum, tungsten, or the like). In some embodiments, the conductive interconnect wires and the conductive interconnect vias may further comprise a diffusion barrier layer and/or a glue layer surrounding the conductive material.

The first access apparatus 104a has a first pair of unipolar selectors, 106a and 108a, and the second access apparatus 104b has a second pair of unipolar selectors, 106b and 108b. The first pair of unipolar selectors, 106a and 108a, are configured to respectively allow current to flow in a single direction and to collectively allow current to flow in opposing directions through the first MTJ device 102a. For example, a first unipolar selector 106a is configured to allow current to pass through the first MTJ device 102a along a first direction 110 (but not along a second direction 112 during normal operation), while a second unipolar selector 108a is configured to allow current to pass through the first MTJ device 102a along the second direction 112 (but not along the first direction 110 during normal operation). The second pair of unipolar selectors, 106b and 108b, are also respectively configured allow current to flow in a single direction and to collectively allow current to flow in opposing directions through the second MTJ device 102b.

It will be appreciated that in various embodiments, the unipolar selectors of an access apparatus may be disposed at various positions within the dielectric structure 204 (e.g., on different metal levels). For example, FIGS. 2A-2C illustrate various embodiments of a first access apparatus 104a comprising a first unipolar selector 106a and a second unipolar selector 106b disposed at different positions within the dielectric structure 204. These embodiments are not limiting but are merely examples of possible positions of unipolar selectors within a disclosed access apparatus.

As shown in cross-sectional view 200 of FIG. 2A, in some embodiments, the first access apparatus 104a comprises a first unipolar selector 106a and a second unipolar selector 108a disposed vertically between a first MTJ device 102a and the substrate 202. In some such embodiments, the first unipolar selector 106a and the second unipolar selector 108a may be disposed along a horizontal plane that is parallel to an upper surface of the substrate 202. In other embodiments (not shown), the first unipolar selector 106a and the second unipolar selector 108a may be vertically separated.

As shown in cross-sectional view 214 of FIG. 2B, in some other embodiments, the first access apparatus 104a comprises a first unipolar selector 106a and a second unipolar selector 108a that are vertically over the first MTJ device 102a. In yet other embodiments, shown in cross-sectional view 216 of FIG. 2C, the first access apparatus 104a comprises a first unipolar selector 106a disposed vertically between the first MTJ device 102a and the substrate 202 and a second unipolar selector 108a that is vertically over the first MTJ device 102a.

Figure 3A:
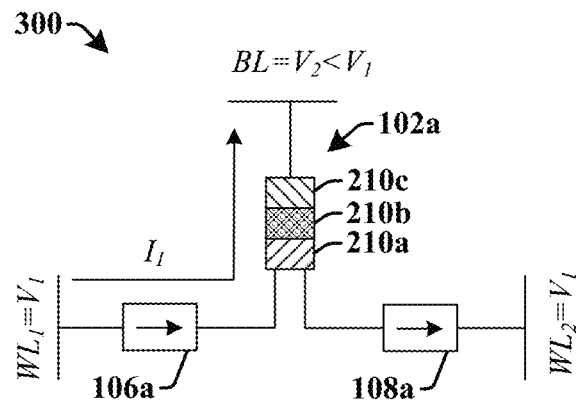
FIGS. 3A-3C illustrate schematic diagrams of some embodiments of read and write operations of a disclosed memory cell of FIG. 2A.
Figure 3B:
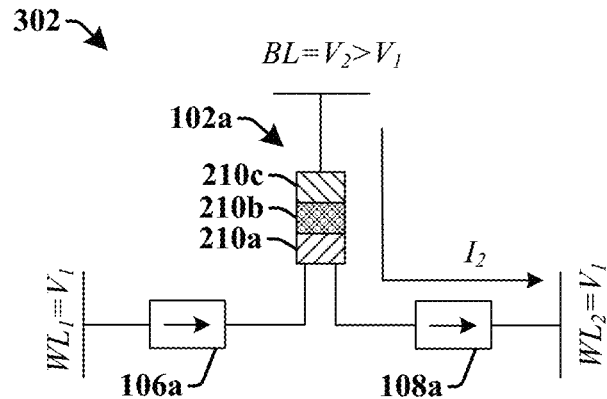
Figure 3C:
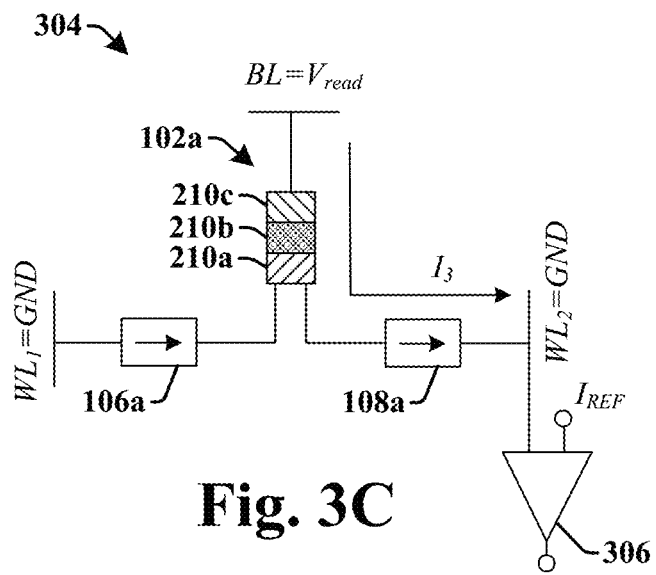

FIGS. 3A-3C illustrate schematic diagrams of some embodiments of read and write operations of the first memory cell of FIG. 2A.

FIG. 3A illustrates a schematic diagram 300 of a first write operation that writes a first data state to the first MTJ device 102a. The first write operation is performed by applying a first non-zero bias voltage $V_1$ (e.g., 6 V) to a first word-line $WL_1$ and a second word-line $WL_2$, and a second non-zero bias voltage $V_2$ (e.g., 2 V) to a bit-line BL. A difference between the first non-zero bias voltage $V_1$ and the second non-zero bias voltage $V_2$ (e.g., 6 V–2V) causes a first current $I_1$ to flow from the first word-line $WL_1$ to the bit-line BL and through the first unipolar selector 106a and the first MTJ device 102a. The second unipolar selector 108a prevents current from flowing from the second word-line $WL_2$ to the bit-line BL. The first current $I_1$ causes a resistance of the first MTJ device 102a to increase by causing the free layer 210c to switch from a parallel configuration to an anti-parallel configuration with respect to the pinned layer 210a. The anti-parallel configuration gives the first MTJ device 102a a high resistive state that correspond to a first data state (e.g., a logical '0').

FIG. 3B illustrates a schematic diagram 302 of a second write operation that writes a second data state to the first MTJ device 102a. The second write operation is performed by applying a first non-zero bias voltage $V_1$ (e.g., 2 V) to the first word-line $WL_1$ and the second word-line $WL_2$, and a second non-zero bias voltage $V_2$ (e.g., 6 V) to the bit-line BL. A difference between the first non-zero bias voltage $V_1$ and the second non-zero bias voltage $V_2$ (e.g., 6 V–2 V) causes a second current $I_2$ to flow from the bit-line BL to the second word-line $WL_2$ and through the second unipolar selector 108a and the first MTJ device 102a. The first unipolar selector 106a prevents current from flowing from the bit-line BL to the first word-line $WL_1$. The second current $I_2$ causes the free layer 210c to switch from an anti-parallel configuration to a parallel configuration with respect to the pinned layer 210a. The parallel configuration has a low resistive state that correspond to a second data state (e.g., a logical '1').

FIG. 3C illustrates a schematic diagram 304 of a read operation that reads data from the first MTJ device 102a. The read operation is performed by holding the first word-line $WL_1$ and the second word-line $WL_2$ at ground (GND) and applying a read voltage $V_{read}$ (e.g., 1.2 V) to the bit-line BL. A difference between the read voltage $V_{read}$ and ground (e.g., 1.2 V–0 V) causes a third current $I_3$ to flow from the bit-line BL to the second word-line $WL_2$ and through the second unipolar selector 108a and the first MTJ device 102a. The third current $I_3$ will have a value that depends upon a resistance of the first MTJ device 102a (e.g., due to Ohms law (V=IR), an MTJ having a high resistance will output a lower current than an MTJ having a low resistance). The third current $I_3$ is provided to a comparator 306, which is configured to compare the third current $I_3$ to a reference current $I_{REF}$ to determine a data state stored in the first MTJ device 102a.

Figure 4A:
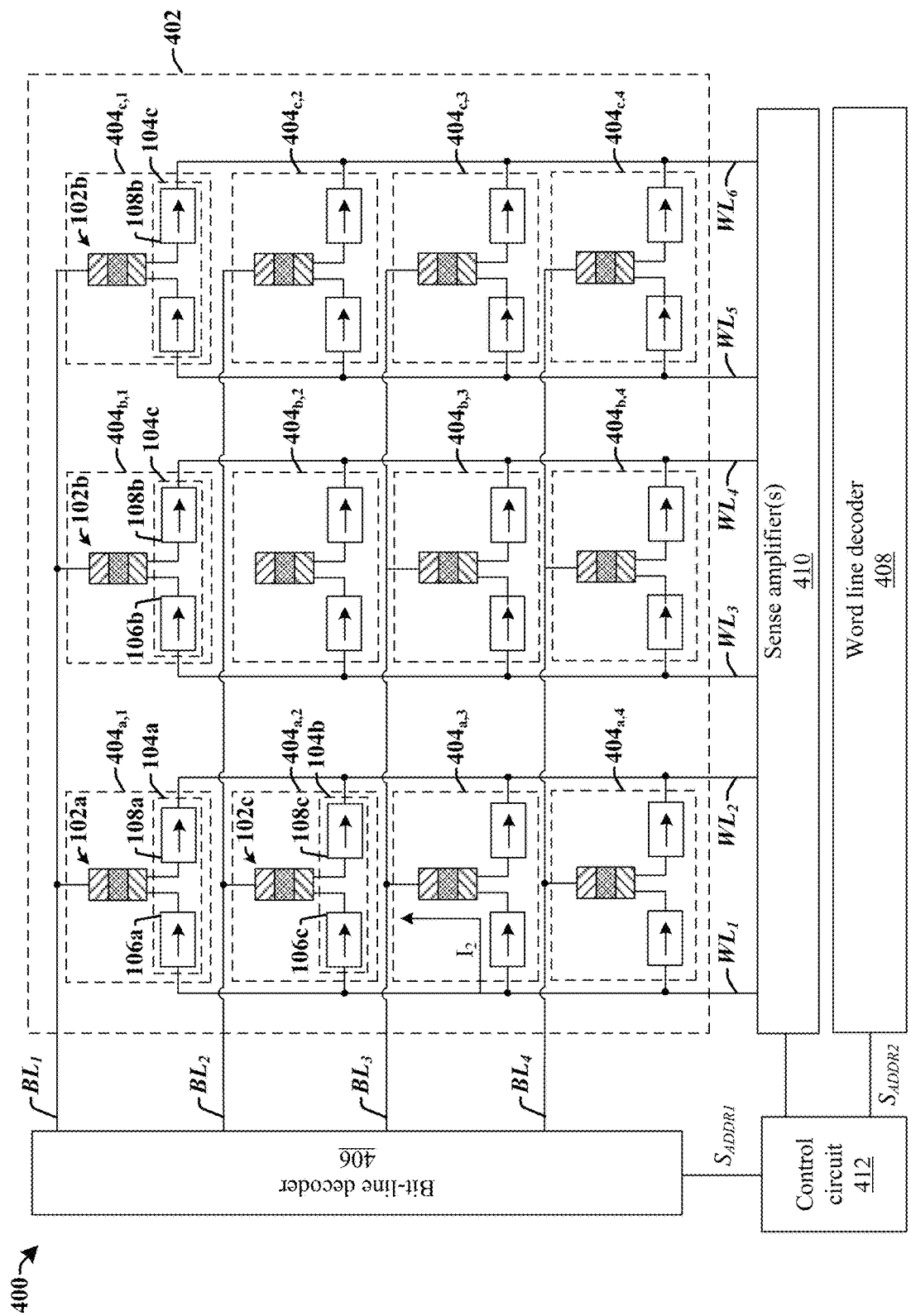
FIG. 4A illustrates a block diagram of some embodiments of a memory circuit comprising a memory array having a plurality of MRAM cells respectively including an access apparatus with a plurality of unipolar selectors.

FIG. 4A illustrates a block diagram of some embodiments of a memory circuit 400 comprising a memory array having a plurality of MRAM cells respectively including an access apparatus with a plurality of unipolar selectors.

The memory circuit 400 comprises a memory array 402 having a plurality of magneto-resistive random access memory (MRAM) cells $404_{a,1}$-$404_{c,4}$. The plurality of MRAM cells $404_{a,1}$-$404_{c,4}$ are arranged within the memory array 402 in rows and/or columns. For example, a first row of MRAM cells comprises MRAM cells $404_{a,1}$-$404_{c,1}$, while a first column of MRAM cells comprises MRAM cells $404_{a,1}$-$404_{a,4}$. The plurality of MRAM cells $404_{a,1}$-$404_{c,4}$ respectively comprise an MTJ device $102n$ (n=a-c) coupled to an access apparatus $104n$ (n=a-c) having a first unipolar selector $106n$ (n=a-c) and a second unipolar selector $108n$ (n=a-c). The access apparatus 104 is configured to selectively provide access to an MTJ device $102n$ (n=a-c) within one or more of the plurality of MRAM cells $404_{a,1}$-$404_{c,4}$ by controlling a current that is provided to an associated MTJ device $102n$ (n=a-c).

The memory array 402 is coupled to control circuitry by way of a plurality of bit lines $BL_1$-$BL_4$ and a plurality of word-lines $WL_1$-$WL_6$. In some embodiments, the control circuitry comprises a bit line decoder 406 coupled to the plurality of bit-lines $BL_1$-$BL_4$ and a word line decoder 408 coupled to the plurality of word-lines $WL_1$-$WL_6$. In some embodiments, the control circuitry may further comprise a sense amplifier 410 coupled to the memory array 402 by way of a plurality of word lines $WL_1$-$WL_6$. The sense amplifier 410 is configured to read data from the plurality of MRAM cells $404_{a,1}$-$404_{c,4}$.

An access apparatus $104n$ (n=a-c) is coupled between an MTJ device $102n$ (n=a-c) and a pair of word-lines, $WL_x$ and $WL_{x+1}$ (x=1-5), while the MTJ device $102n$ (n=a-c) is coupled between the access apparatus $104n$ (n=a-c) and a bit-line $BL_y$ (y=1-4). It will be appreciated that coupling the different unipolar selectors of an access apparatus to different word lines can reduce leakage in non-selected memory cells.

To access an MTJ device $102n$ (n=a-c), the bit line decoder 406 is configured to selectively apply a first voltage to one or more of the bit lines $BL_1$-$BL_4$ based upon a first address $S_{ADDR1}$ received from a control circuit 412, while the word line decoder 408 is configured to selectively apply a second voltage to one or more of the word lines $WL_1$-$WL_6$ based upon a second address $S_{ADDR2}$ received from the control circuit 412. The applied voltages will cause a current to flow through either the first unipolar selector $106a$ or the second unipolar selector $108a$, which is greater than or equal to a threshold voltage of the first unipolar selector $106a$ and the second unipolar selector $108a$.

Figures 4B, 5A:
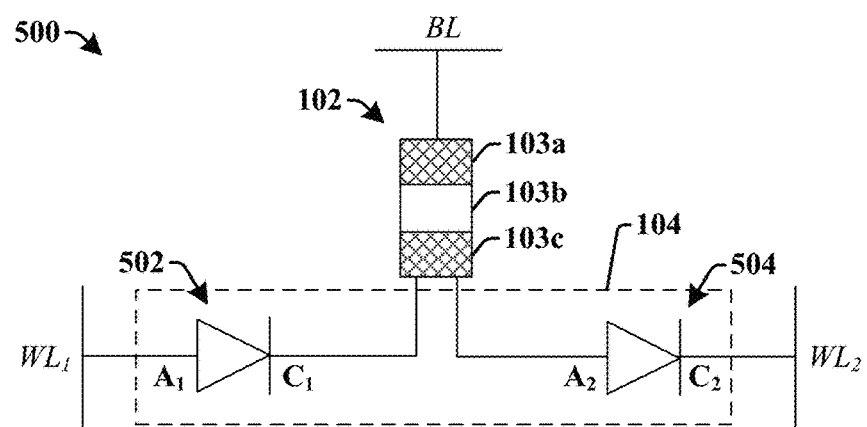
FIG. 4B illustrates a table showing some embodiments of exemplary operating conditions of the memory array of FIG. 4A.
FIGS. 5A-5C illustrate some additional embodiments of a memory circuit having an access apparatus comprising a plurality of unipolar selectors including diodes.

For example, FIG. 4B illustrates a table 414 illustrating some exemplary bias conditions for read and write operations on a first MRAM cell $404_{a,1}$ of the memory array 402 of FIG. 4A. The read and write operations illustrated in FIG. 4B respectively read or write a single data state to a single MRAM cell, so as to use a multi-step process to read or write data to an entire row of the memory array 402.

A first row 416 of table 414 illustrates some exemplary bias conditions of a first write operation that writes a first data state to the first MRAM cell $404_{a,1}$ by changing the first MTJ device $102a$ to a high resistive state (i.e., an anti-parallel configuration). The first write operation holds the first bit-line $BL_1$ at ground (GND), the first word line $WL_1$ at $V_{DD}$, and the second word line $WL_2$ at $V_{DD}$. A voltage difference between the first word-line $WL_1$ and the first bit-line $BL_1$ (e.g., $V_{DD}$–GND) causes a current to flow through the first unipolar selector $106a$ and through the first MTJ device $102a$ along a direction extending from the first word-line $WL_1$ to the first bit-line $BL_1$. A voltage difference between the second word-line $WL_2$ and the first bit-line $BL_1$ will not cause a current to flow through the first MTJ device $102a$ since the second unipolar selector $108a$ prevents the flow of current along a direction extending from the second word-line $WL_2$ to the first bit-line $BL_1$.

During the first write operation the second bit-line $BL_2$ is held at $V_{DD}$–$\Delta V$, the third bit-line $BL_3$ at $V_{DD}$–$\Delta V$, a third word-line $WL_3$ at a floating voltage state (Float), and a fourth word-line $WL_4$ at $V_{DD}$–$2\Delta$. A voltage difference between the second bit-line $BL_2$ and the first word-line $WL_1$ (e.g., $V_{DD}$–$(V_{DD}$–$\Delta V)$) is too small to write data to the second MRAM cell $404_{a,2}$, while the second unipolar selector $108b$ prevents the flow of current along a direction extending from the third word-line $WL_3$ to the second bit-line $BL_2$. A voltage difference between the first bit-line $BL_1$ and the third word-line $WL_3$ (e.g., GND–Float) is too small to write data to the second MRAM cell $404_{a,2}$, while the second unipolar selector $108c$ prevents the flow of current along a direction extending from the fourth word-line $WL_4$ to the first bit-line $BL_1$.

A second row 418 of table 414 illustrates some exemplary bias conditions of a second write operation that writes a second data state to the first MRAM cell $404_{a,1}$ by changing the first MTJ device $102a$ to a low resistive state (i.e., a parallel configuration). A third row 420 of table 414 illustrates some exemplary bias conditions of a read operation that reads a data state from the first MRAM cell $404_{a,1}$. In some embodiments, a read voltage $V_{read}$ using during the read operation may be approximately equal to $V_{DD}/5$. In some embodiments, $\Delta V$ may be approximately equal to or smaller than $V_{read}$.

Figure 5B:
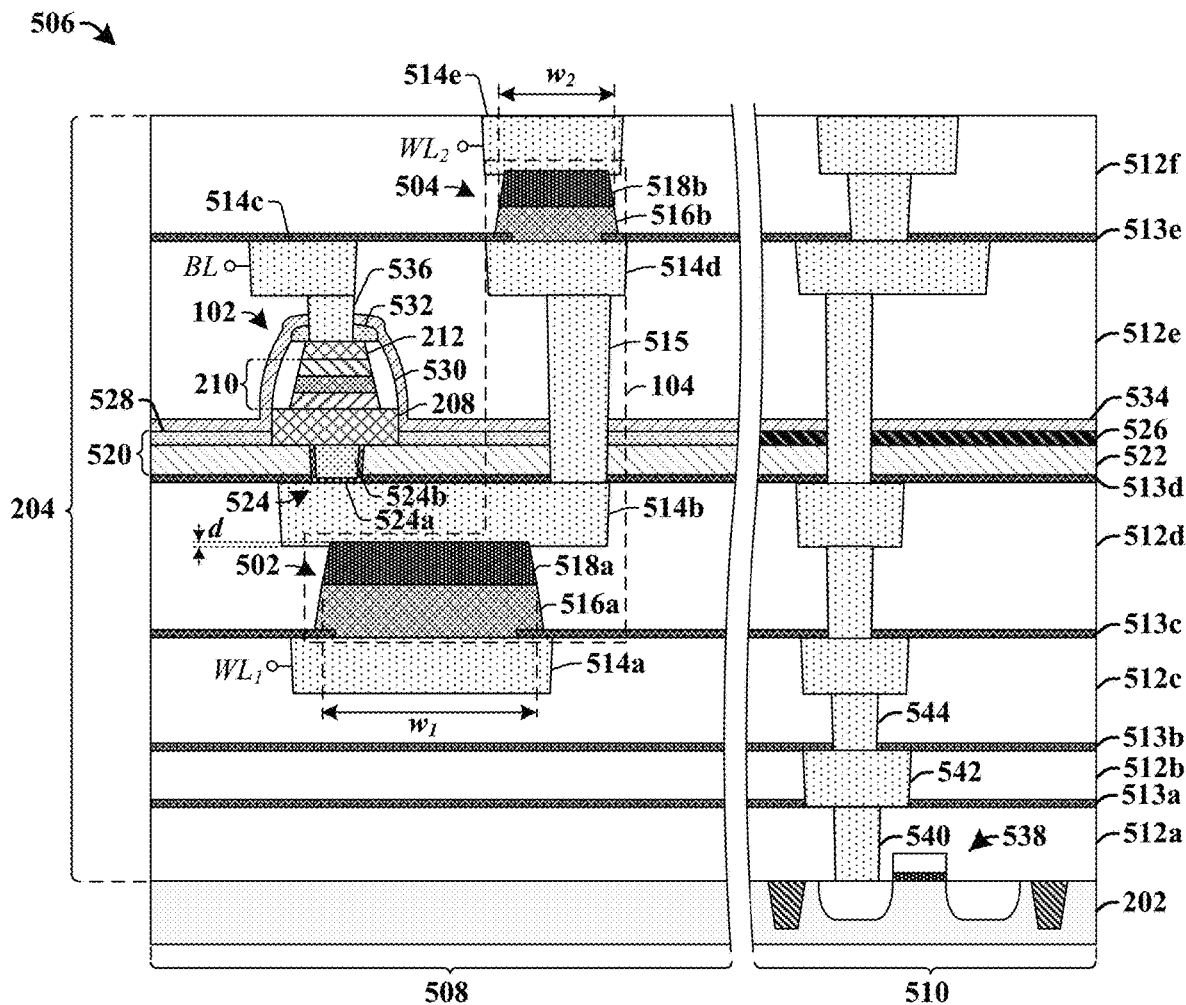
Figure 5C:
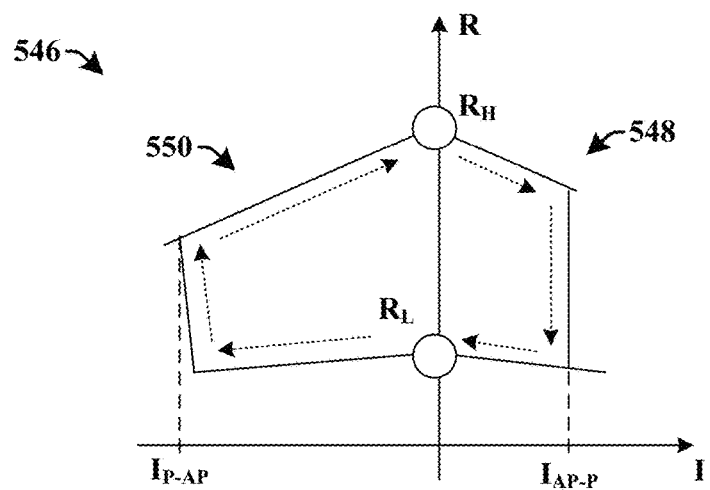

FIGS. 5A-5C illustrate some additional embodiments of a memory circuit having an access apparatus comprising a plurality of diodes configured to collectively provide access to an MTJ device. Although the memory circuits of FIGS. 5A-6B are described in relation to unipolar selectors comprising diodes, the memory circuits may also be applied to other types of unipolar selectors (e.g., filament based unipolar selectors, rectifiers, varistor-type selectors, or the like).

FIG. 5A illustrates a schematic diagram 500 of a memory cell having an access apparatus comprising diodes configured to collectively provide access to an MTJ device.

The memory cell comprises a MTJ device 102 coupled between a bit-line BL and an access apparatus 104 comprising a first diode 502 and a second diode 504. The first diode 502 has a first anode terminal $A_1$ coupled to a first word line $WL_1$ and a first cathode terminal $C_1$ coupled to the MTJ device 102. The second diode 504 has a second cathode terminal $C_2$ coupled to a second word line $WL_2$ and a second anode terminal $A_2$ coupled to the MTJ device 102.

FIG. 5B illustrates a cross-sectional view of some embodiments of an integrated chip 506 corresponding to the schematic diagram 500 of FIG. 5A.

The integrated chip 506 comprises a substrate 202 including an embedded memory region 508 and a logic region 510. A dielectric structure 204 is arranged over the substrate 202. The dielectric structure 204 comprises a plurality of stacked inter-level dielectric (ILD) layers $512a$-$512f$ vertically separated by etch stop layers $513a$-$513e$. In some embodiments, the plurality of stacked ILD layers $512a$-$512f$ may comprise one or more of silicon dioxide, SiCOH, a fluorosilicate glass, a phosphate glass (e.g., borophosphate silicate glass, etc.), or the like. In some embodiments, the etch stop layers $513a$-$513e$ may comprise a nitride (e.g., silicon nitride), a carbide (e.g., silicon carbide), or the like.

Within the embedded memory region 508, an access apparatus 104 is coupled to a MTJ device 102. The access apparatus 104 comprises a first diode 502 and a second diode 504. The first diode 502 is arranged between a first interconnect wire 514a and a second interconnect wire 514b. In some embodiments, the first diode 502 may have a width that decreases as a distance from the substrate 202 increases, while the second interconnect wire 514b may have a width that increases as a distance from the substrate 202 increases. In some embodiments, the second interconnect wire 514b vertically extends a distance d below a top of the first diode 502. In such embodiments, the second interconnect wire 514b is disposed along parts of sidewalls of the first diode 502. In some embodiments, the first diode 502 comprises a Schottky diode having a first metal layer 516a and a first semiconductor layer 518a contacting a top of the first metal layer 516a.

The first metal layer 516a operates as an anode terminal and the first semiconductor layer 518a operates as a cathode terminal. In some embodiments, the first semiconductor layer 518a is disposed between the first metal layer 516a and the MTJ device 102 along a first conductive path, so that the first diode 502 is configured to allow the flow of current from the first interconnect wire 514a to the second interconnect wire 514b (i.e., along a first direction through the MTJ device 102). In some embodiments, the first metal layer 516a may comprise platinum, palladium, iridium, ruthenium, or the like. In some embodiments, the first semiconductor layer 518a may comprise silicon (e.g., n-doped silicon), germanium, a III-V semiconductor, a semiconductor-oxide, indium gallium zinc oxide (IGZO), or the like.

The second interconnect wire 514b is further coupled to the MTJ device 102 disposed over the second interconnect wire 514b. The MTJ device 102 has an MTJ 210 disposed between a bottom electrode 208 and a top electrode 212. In some embodiments, sidewall spacers 530 are disposed along opposing sides of the MTJ 210. The sidewalls spacers 530 may have curved outermost sidewalls facing away from the MTJ 210. In various embodiments, the sidewalls spacers 530 may comprise silicon nitride, silicon dioxide ($SiO_2$), silicon oxy-nitride (e.g., SiON), or the like. In some embodiments, a cap layer 532 may be disposed over the MTJ 210 and the sidewall spacers 530. In various embodiments, the cap layer 532 may comprise silicon nitride, a silicon dioxide ($SiO_2$), silicon oxy-nitride (e.g., SiON), silicon carbide, or the like. In some embodiments, an encapsulation layer 534 is over the sidewall spacers 530 and the cap layer 532. In some embodiments, the encapsulation layer 534 may comprise an oxide (e.g., silicon rich oxide), a nitride (e.g., silicon nitride), a carbide (e.g., silicon carbide), or the like. In some embodiments, a top electrode via 536 extends through the encapsulation layer 534 and the cap layer 532 to contact the top electrode 212. The top electrode via 536 couples the top electrode 212 to a third interconnect wire 514c. In some embodiments, the top electrode via 536 may comprise aluminum, copper, tungsten, or the like.

In some embodiments, a lower insulating structure 520 may be disposed between the second interconnect wire 514b and the MTJ device 102. In some embodiments, the lower insulating structure 520 may be separated from a fourth ILD layer 512d by a fourth etch stop layer 513d. The lower insulating structure 520 comprises sidewalls defining an opening between the bottom electrode 208 and the second interconnect wire 514b. A bottom electrode via 524 extends through the opening in the lower insulating structure 520. In some embodiments, the bottom electrode via 524 may comprise a diffusion barrier layer 524a and an overlying metal 524b.

In some embodiments, the lower insulating structure 520 comprises a first dielectric layer 522, a second dielectric layer 526 over the first dielectric layer 522, and a third dielectric layer 528 over the first dielectric layer 522 and laterally abutting the second dielectric layer 526. In some embodiments, the first dielectric layer 522 extends to a top of a bottom electrode via 524. In such embodiments, a bottom electrode 208 may be on a top of the first dielectric layer 522. In some embodiments, the third dielectric layer 528 is completely over the bottom electrode via 524 and laterally surrounds the bottom electrode 208.

In some embodiments, the first dielectric layer 522 may comprise silicon rich oxide or the like. In some embodiments, the first dielectric layer 522 may have a greater (i.e., larger) thickness in the logic region 510 than in the embedded memory region 508. In some embodiments, the second dielectric layer 526 may comprise silicon carbide, silicon nitride, or the like. In some embodiments, the second dielectric layer 526 may be a same material as the cap layer 532 over the MTJ device 102. In some embodiments, the third dielectric layer 528 may comprise Tetraethyl orthosilicate (TEOS) or the like.

The second interconnect wire 514b is further coupled to the second diode 504 by way of an interconnect via 515 and a fourth interconnect wire 514d. In some embodiments, the first diode 502 laterally extends between a first vertical line intersecting the MTJ device 102 and a second vertical line intersecting the second diode 504. In some such embodiments, the first diode 502 has an uppermost surface that continuously extends from directly below the MTJ device 102 to directly below the second diode 504.

In some embodiments, the second diode 504 comprises a Schottky diode having a second metal layer 516b and a second semiconductor layer 518b contacting a top of the second metal layer 516b. The second metal layer 516b operates as an anode terminal and the second semiconductor layer 518b operates as the cathode terminal. In some embodiments, the second metal layer 516b is disposed between the first semiconductor layer 518a and the MTJ device 102 along a second conductive path, so that the second diode 504 is configured to allow the flow of current from the second interconnect wire 514b to a fifth interconnect wire 514e (i.e., along a second direction through the MTJ device 102). In some embodiments, the second metal layer 516b may comprise platinum, palladium, iridium, ruthenium, or the like. In some embodiments, the second semiconductor layer 518b may comprise silicon (e.g., n-doped silicon), germanium, a III-V semiconductor, a semiconductor-oxide, indium gallium zinc oxide (IGZO), or the like.

Within the logic region 510, one or more additional interconnect layers are disposed within the dielectric structure 204. The one or more additional interconnect layers comprise a conductive contact 540, an interconnect wire 542, and an interconnect via 544. The one or more additional interconnect layers are coupled to a logic device 538 arranged within the substrate 202. In some embodiments, the logic device 538 may comprise a transistor device (e.g., a MOSFET, a bi-polar junction transistor (BJT), a high electron mobility transistor (HEMT), or the like).

In some embodiments, the first diode 502 may have a first width $w_1$ (e.g., measured along an interface between the first metal layer 516a and the first semiconductor layer 518a) and the second diode 504 may have a second width $w_2$ (e.g., measured along an interface between the second metal layer 516b and the second semiconductor layer 518b). In some embodiments, the first width $w_1$ is substantially equal to the second width $w_2$. In other embodiments, the first width $w_1$ and the second width $w_2$ may be different. In some embodiments, the first width $w_1$ and the second width $w_2$ are proportional to currents used to make transitions between resistive states of the MTJ device 102. By having the first width $w_1$ and the second width $w_2$ proportional to currents used to make transitions between resistive states of the MTJ device 102, an intrinsic asymmetry of an MTJ's operation can be optimized. For example, FIG. 5C illustrates some embodiments of a graph 546 showing an exemplary current versus a resistance for the MTJ device 102.

As shown in graph 546, a resistance (R) is shown on the y-axis and a current (I) is shown on the x-axis. Transitions between a high resistive state $R_H$ (i.e., an anti-parallel configuration) and a low resistive state $R_L$ (i.e., a parallel configuration) change according to a hysteresis loop that is asymmetric. For example, when a MTJ device is in the high resistive state $R_H$ a current $I_{AP-P}$ having a first magnitude will cause the MTJ device to change from the high resistive state to a low resistive state along segment 548 of the hysteresis loop. When the MTJ device is in a low resistive state a current $I_{P-AP}$ having a second magnitude will cause the MTJ device to change from the low resistive state to the high resistive state along segment 550 of the hysteresis loop.

Therefore, a transition from the high resistive state $R_H$ to the low resistive state $R_L$ uses a current $I_{AP-P}$ having a first magnitude, while a transition from the low resistive state $R_L$ to the high resistive state $R_H$ uses a current $I_{P-AP}$ having a second magnitude that is larger than the first magnitude. In such embodiments, the first width $w_1$ of the first diode 502 (i.e., the diode configured to provide a current through the MTJ device 102 along a first direction that facilies a parallel to anti-parallel transition) may be larger than a second width $w_2$ of the second diode 504 (i.e., the diode configured to provide a current through the MTJ device 102 along a second direction that facilies an anti-parallel to parallel transition). It will be appreciated that orienting the first diode 502 to provide a larger current through the MTJ device 102 than the second diode 504 allows for a density of a memory array to be further increased since the first diode 502 underlies both the MTJ device 102 and the second diode 504 (and thus can be made larger without increasing a size of a memory cell).

Figure 6A:
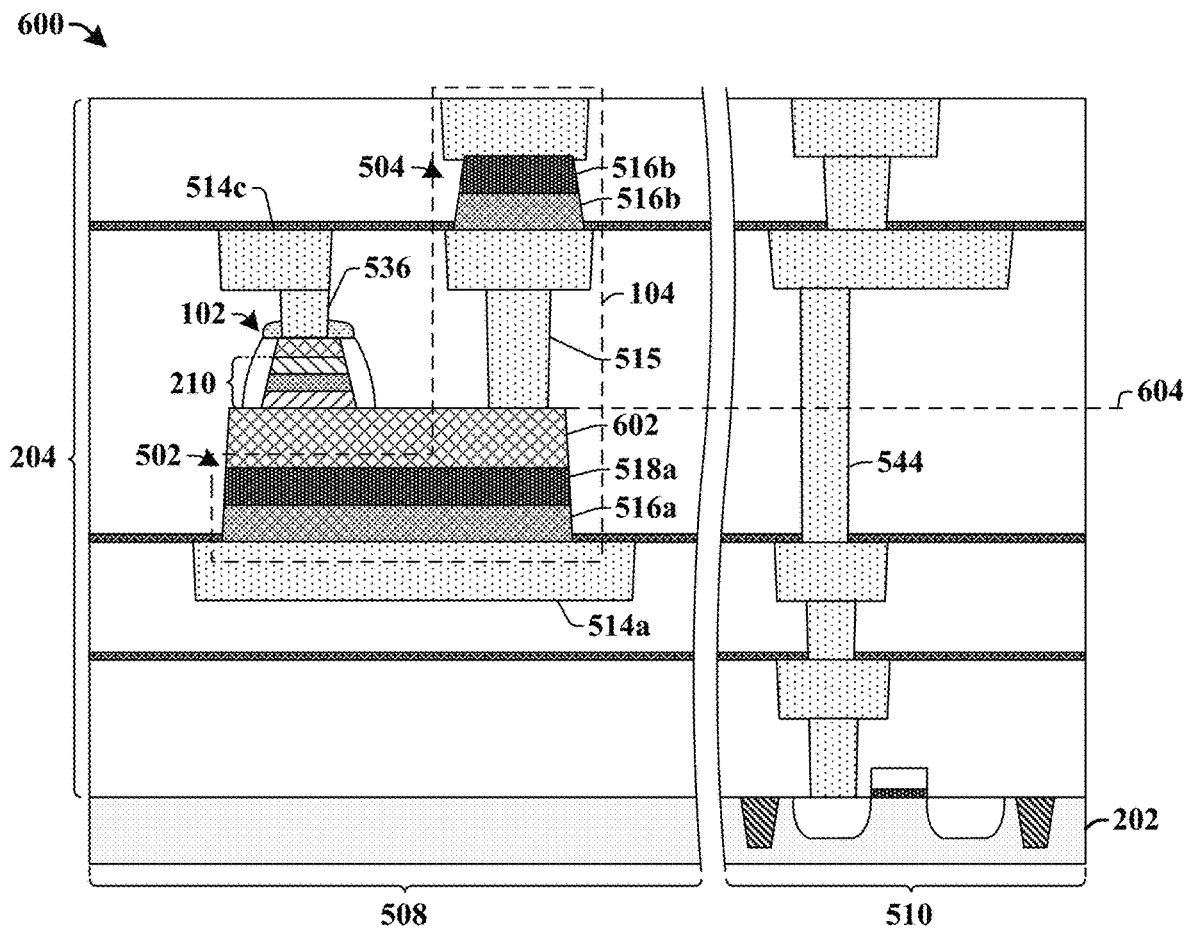
FIGS. 6A-6B illustrate some additional embodiments of a memory circuit having an access apparatus comprising a plurality of unipolar selectors including diodes.

FIG. 6A illustrates a cross-sectional view of some alternative embodiments of an integrated chip 600 comprising a memory circuit having an access apparatus including a plurality of diodes configured to collectively provide access to an MTJ device.

The integrated chip 600 comprises a substrate 202 having an embedded memory region 508 and a logic region 510. A dielectric structure 204 is arranged over the substrate 202 and comprises a plurality of stacked inter-level dielectric (ILD) layers 512a-512f vertically separated by etch stop layers 513a-513e.

Within the embedded memory region 508, an access apparatus 104 is coupled to an MTJ device 102. The access apparatus 104 comprises a first diode 502 and a second diode 504. The first diode 502 is disposed over a first interconnect wire 514a. The first diode 502 comprises a first metal layer 516a and a first semiconductor layer 518a contacting a top of the first metal layer 516a.

An additional metal layer 602 is disposed on a top of the first semiconductor layer 518a. In some embodiments, the additional metal layer 602 may comprise a metal that forms an Ohmic contact with the first semiconductor layer 518a. For example, in some embodiments, the additional metal layer 602 may comprise molybdenum, titanium nitride, silver, or the like. In some embodiments, the first diode 502 and the additional metal layer 602 may respectively have widths that decrease as a distance from the substrate 202 increases. In some embodiments, sidewalls of the first diode 502 and sidewalls of the additional metal layer 602 may be substantially aligned (e.g., along a line).

An MTJ device 102 and an interconnect via 515 are disposed onto an upper surface of the additional metal layer 602. In some embodiments, an additional etch stop layer (not shown) may be disposed between the additional metal layer 602 and the MTJ device 102. The interconnect via 515 is further coupled to a second diode 504.

Within the logic region 510, an interconnect via 544 is laterally separated from the MTJ device 102 and the interconnect via 515. A top surface of the additional metal layer 602 extends along a horizontal plane 604 that intersects the interconnect via 544 at a position between a top surface and a bottom surface of the interconnect via 544.

Figure 6B:
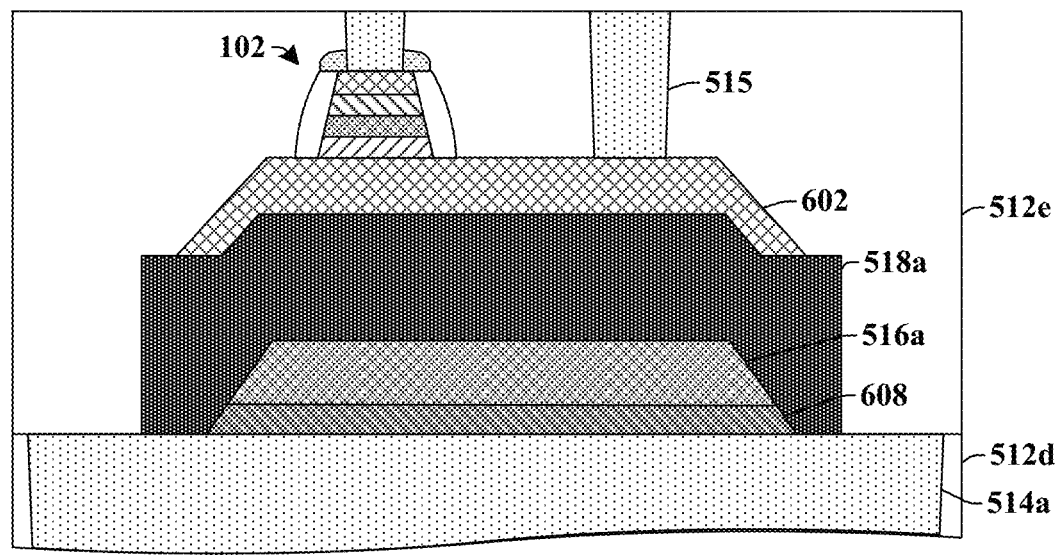

FIG. 6B illustrates a cross-sectional view of some alternative embodiments of a diode 606 that may be used in the access apparatus as a first diode or a second diode.

The diode 606 is disposed over a first interconnect wire 514a and comprises a first metal layer 516a and a first semiconductor layer 518a contacting a top of the first metal layer 516a. An additional metal layer 602 is disposed on a top of the first semiconductor layer 518a. In some embodiments, an adhesion enhancement layer 608 (e.g., titanium, tantalum, or the like) may be disposed between the first metal layer 516a and the first interconnect wire 514a. In some embodiments, the first semiconductor layer 518a may extend along sidewalls of the adhesion enhancement layer 608 and the first metal layer 516a. In some such embodiments, the first semiconductor layer 518a may contact the first interconnect wire 514a along outermost sidewalls of the first metal layer 516a. In some embodiments, the additional metal layer 602 may extend along sidewall and over a horizontally extending surface of the first semiconductor layer 518a.

FIGS. 7-15 illustrate cross-sectional views 700-1500 of some embodiments of a method of forming an integrated chip having an access apparatus comprising a plurality of unipolar selectors configured to selectively provide access to an MTJ device. Although FIGS. 7-15 are described in relation to a method, it will be appreciated that the structures disclosed in FIGS. 7-15 are not limited to such a method, but instead may stand alone as structures independent of the method. Furthermore, although FIGS. 7-15 are described in relation to unipolar selectors comprising diodes, the method may also be applied to other types of unipolar selectors.

Figure 7:
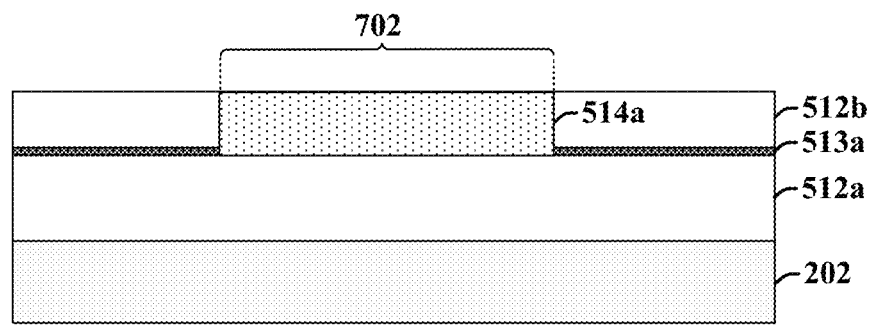
FIGS. 7-15 illustrate some embodiments of a method of forming an integrated chip having an access apparatus comprising a plurality of unipolar selectors configured to selectively provide access to an MTJ device.

As shown in cross-sectional view 700 of FIG. 7, a first interconnect wire 514a is formed over a substrate 202. In some embodiments, the first interconnect wire 514a is formed within a second inter-level dielectric (ILD) layer 512b that is separated from the substrate 202 by a first ILD layer 512a. In some embodiments, the first ILD layer 512a and the second ILD layer 512b are separated by a first etch stop layer 513a. The second ILD layer 512b is patterned to define a trench 702. In some embodiments, the second ILD layer 512b may be patterned by forming a patterned masking layer (not shown) over the second ILD layer 512b and performing an etching process to remove parts of the second ILD layer 512b not covered by the patterned masking layer. A conductive material is formed within the trench 702, followed by a subsequent planarization process (e.g., a chemical mechanical planarization process) to form the first interconnect wire 514a.

In various embodiments, the substrate 202 may be any type of semiconductor body (e.g., silicon, SiGe, SOI, etc.), such as a semiconductor wafer and/or one or more die on a wafer, as well as any other type of semiconductor and/or epitaxial layers, associated therewith. In some embodiments, the first ILD layer 512a and the second ILD layer 512b may comprise one or more dielectric materials, such as silicon dioxide (SiO$_2$), SiCOH, a fluorosilicate glass, a phosphate glass (e.g., borophosphate silicate glass), or the like. In some embodiments, the conductive material may comprise a metal (e.g., aluminum, copper, tungsten, etc.) formed by way of a deposition process (e.g., CVD, PVD, PE-CVD, ALD, etc.). In various embodiments, the first interconnect wire 514a can be a first interconnect wire layer, a second interconnect layer, a third interconnect wire layer, or a higher metal interconnect wire layer.

Figure 8A:
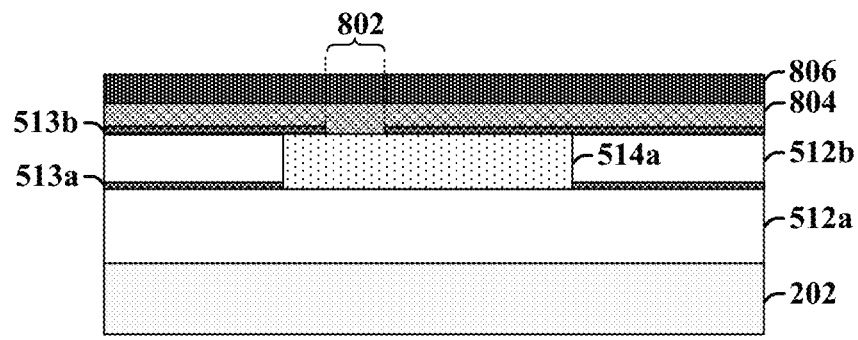
Figure 8B:
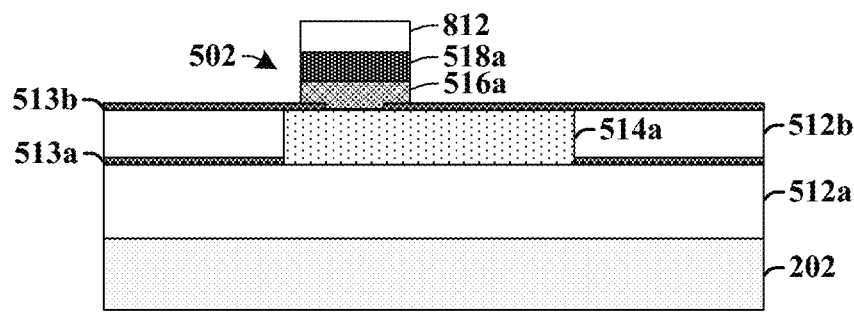
Figure 8C:
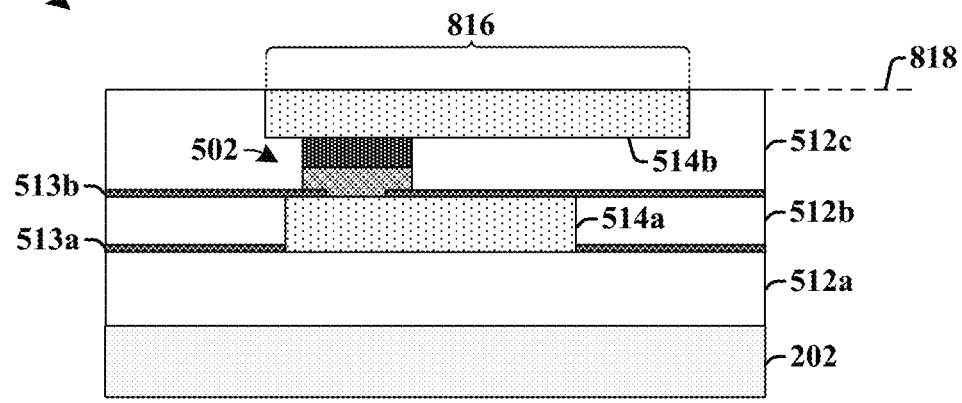

FIGS. 8A-8C illustrate some embodiments of cross-sectional views showing the formation of a first diode 502 on the first interconnect wire 514a.

As shown in cross-sectional view 800 of FIG. 8A, in some embodiments, a second etch stop layer 513b may be formed over the second ILD layer 512b and the first interconnect wire 514a. The second etch stop layer 513b may be formed by a deposition process. The second etch stop layer 513b is subsequently patterned to form an opening 802 over the first interconnect wire 514a.

A first layer of diode metal 804 is formed over the second etch stop layer 513b and within the opening 802. The first layer of diode metal 804 may be formed by a deposition process. In some embodiments, the first layer of diode metal 804 may be formed to a thickness of between approximately 10 nm and approximately 50 nm. In some embodiments, the first layer of diode metal 804 may be formed to a thickness of between approximately 20 nm and approximately 100 nm. A first layer of semiconductor material 806 is formed onto the first layer of diode metal 804. In some embodiments, the first layer of semiconductor material 806 may be formed to a thickness of between approximately 50 nm and approximately 150 nm. The first layer of semiconductor material 806 forms a Schottky barrier at an interface between the first layer of semiconductor material 806 and the first layer of diode metal 804.

As shown in cross-sectional view 808 of FIG. 8B, the first layer of diode metal (804 of FIG. 8A) and the first layer of semiconductor material (806 of FIG. 8B) are selectively patterned to define a first diode 502 over the first interconnect wire 514a. The first diode 502 comprises a Schottky diode having a first metal layer 516a and a first semiconductor layer 518a. In some embodiments, the first layer of diode metal (804 of FIG. 8A) and the first layer of semiconductor material (806 of FIG. 8B) are selectively exposed to an etchant 810 in areas not covered by a first masking layer 812. In some embodiments, the first masking layer 812 may comprise photoresist or a hard mask (e.g., titanium, silicon nitride, or the like). The first masking layer 812 is removed after patterning of the first diode 502.

As shown in cross-sectional view 814 of FIG. 8C, a third ILD layer 512c is formed over the first diode 502. The third ILD layer 512c is patterned to define a trench 816 overlying the first diode 502. The trench 816 is filled with a conductive material followed by a planarization process (along line 818) to remove conductive material from over the third ILD layer 512c. The planarization process defines a second interconnect wire 514b that is between a top of the first diode 502 and an upper surface of the third ILD layer 512c.

Figure 9A:
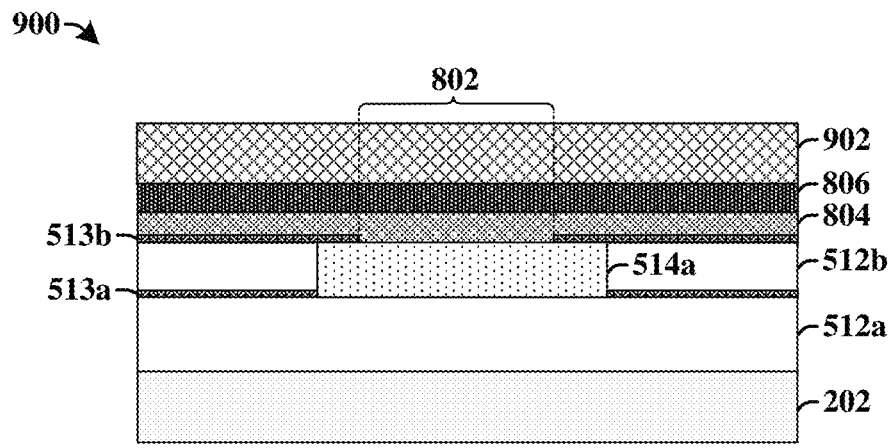
Figure 9B:
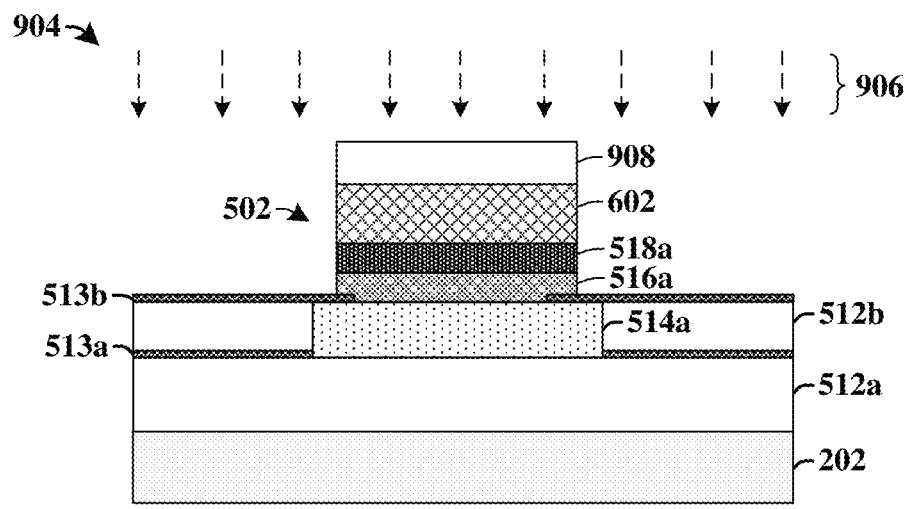
Figure 9C:
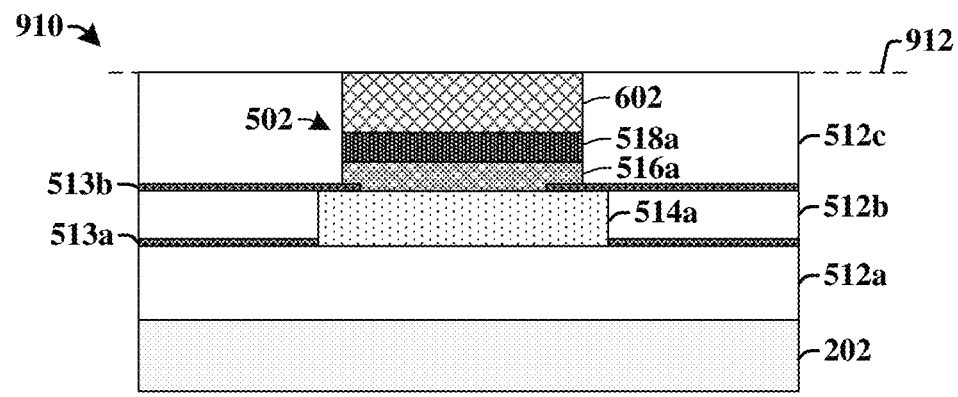

FIGS. 9A-9C illustrate some alternative embodiments of cross-sectional views showing the formation of a first diode 502 on the first interconnect wire 514a.

As shown in cross-sectional view 900 of FIG. 9A, a second etch stop layer 513b is formed over the second ILD layer 512b and the first interconnect wire 514a. The second etch stop layer 513b is subsequently patterned to form an opening 802 over the first interconnect wire 514a. A first layer of diode metal 804 is formed over the second etch stop layer 513b and within the opening 802, a first layer of semiconductor material 806 is formed onto the first layer of diode metal 804, and a layer of additional metal 902 is formed on the first layer of semiconductor material 806. The layer of additional metal 902 comprises a metal that is configured to form an Ohmic contact with the first layer of semiconductor material 806.

As shown in cross-sectional view 904 of FIG. 9B, the first layer of diode metal (804 of FIG. 9A), the first layer of semiconductor material (806 of FIG. 9A), and the layer of additional metal (902 of FIG. 9A) are selectively patterned to define a first diode 502 over the first interconnect wire 514a. The first diode 502 comprises a Schottky diode having a first metal layer 516a and a first semiconductor layer 518a. An additional metal layer 602 is disposed over the first diode 502. In some embodiments, the first layer of diode metal (804 of FIG. 9A), the first layer of semiconductor material (806 of FIG. 9A), and the layer of additional metal (902 of FIG. 9A) are selectively exposed to an etchant 906 in areas not covered by a second masking layer 908. In some embodiments, the second masking layer 908 may comprise a photoresist or a hard mask (e.g., titanium, silicon nitride, or the like). The second masking layer 908 is removed after patterning of the first diode 502.

As shown in cross-sectional view 910 of FIG. 9C, a third ILD layer 512c is formed over the first diode 502. A planarization process (along line 912) is subsequently performed to remove a part of the third ILD layer 512c and expose a top of the additional metal layer 602.

Figure 10:
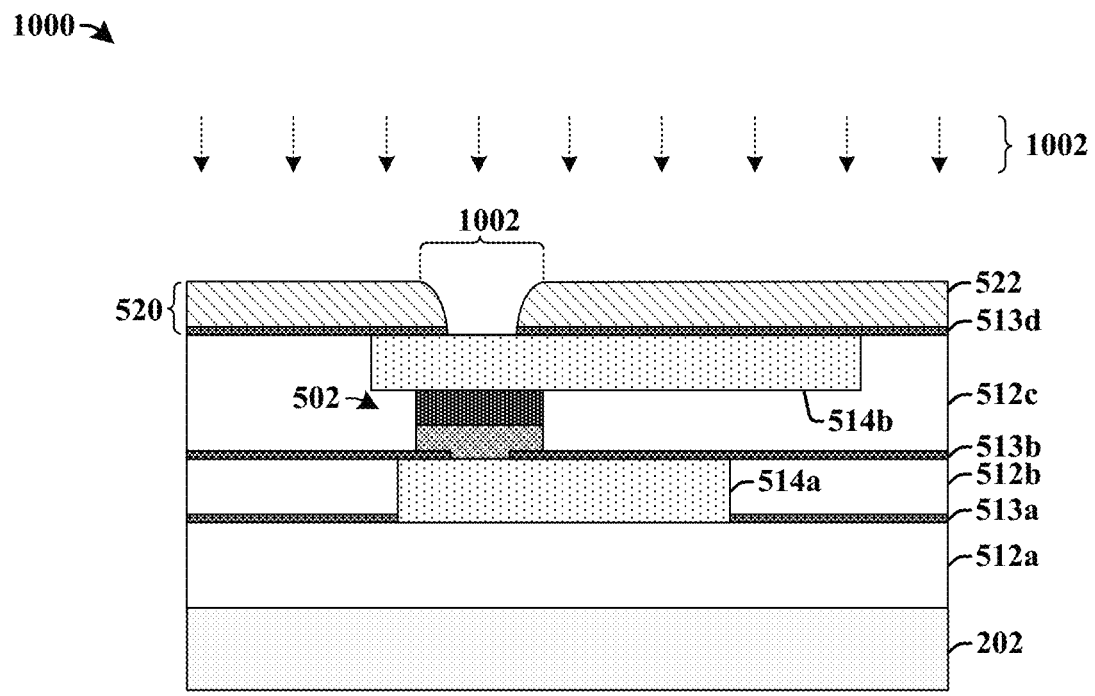

As shown in cross-sectional view 1000 of FIG. 10, a lower insulating structure 520 is formed over the third ILD layer 512c. In some embodiments, the lower insulating structure 520 may be deposited and then selectively patterned to define a bottom electrode via opening 1002 over the second interconnect wire 514b. In some embodiments, the lower insulating structure 520 may comprise a fourth etch stop layer 513d and a first dielectric layer 522 disposed over the fourth etch stop layer 513d. In various embodiments, the first dielectric layer 522 may comprise one or more of silicon carbide, silicon rich oxide, TEOS (tetraethyl orthosilicate), or the like.

Figure 11:
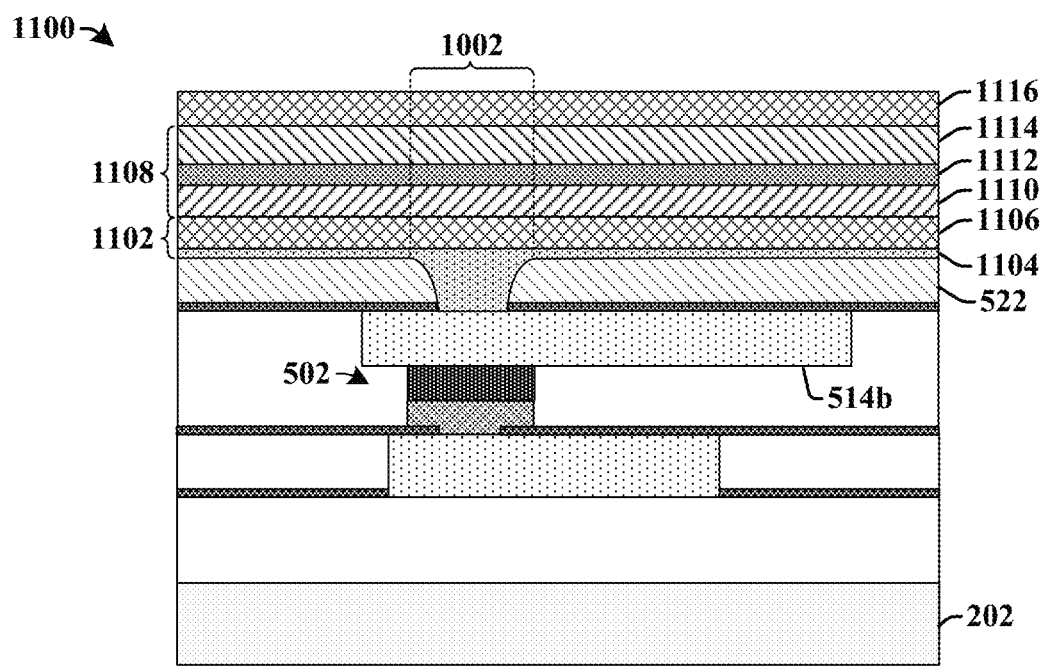

As shown in cross-sectional view 1100 of FIG. 11, a bottom electrode structure 1102 is formed over the lower insulating structure 520 and within the bottom electrode via opening 1002. In some embodiments, the bottom electrode structure 1102 may comprise a bottom electrode via layer 1104 and an overlying bottom electrode layer 1106. An MRAM stack 1108 is formed over the bottom electrode structure 1102. In some embodiments, the MRAM stack 1108 may comprise a pinned layer 1110, a dielectric barrier tunnel layer 1112, and a free layer 1114. In some embodiments, the pinned layer 1110 may be formed between the free layer 1114 and the bottom electrode structure 1102. In other embodiments (not shown), the free layer 1114 may be formed between the pinned layer 1110 and the bottom electrode structure 1102. A top electrode structure 1116 is formed over the MRAM stack 1108.

Figure 12:
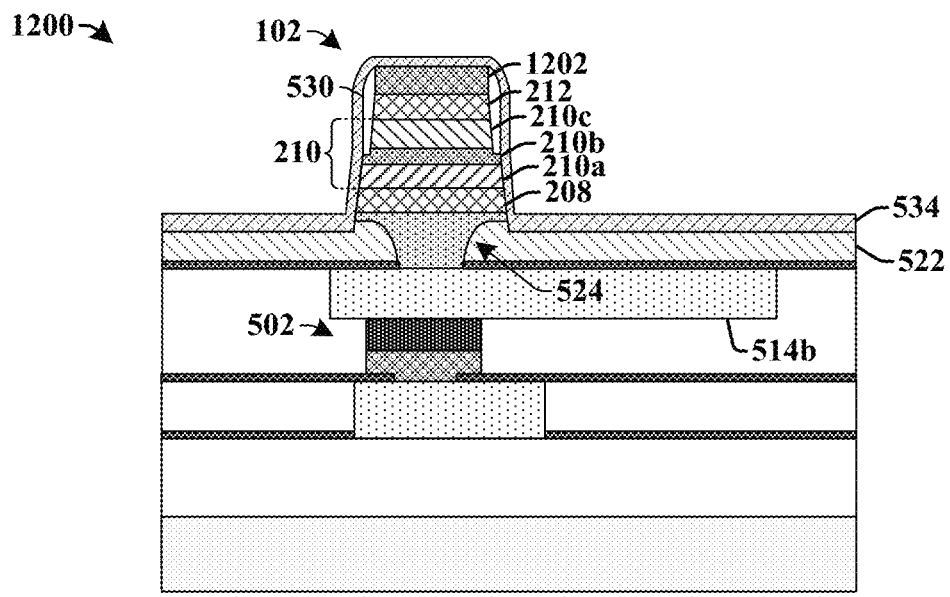

As shown in cross-sectional view 1200 of FIG. 12, the top electrode structure (1116 of FIG. 11), the MTJ stack (1108 of FIG. 11), and the bottom electrode structure (1102 of FIG. 11) are selectively patterned to define an MTJ device 102 having a bottom electrode 208 separated from a top electrode 212 by an MTJ 210. In some embodiments, the top electrode structure (1116 of FIG. 11) and the MTJ stack (1108 of FIG. 11) may be selectively etched according to a mask layer 1202 (e.g., silicon nitride, silicon carbide, or the like) formed over the top electrode structure to define a top electrode 212 and an MTJ 210. Sidewall spacers 530 are subsequently formed along sides of the MTJ 210 and a second etching process is performed to selectively etch the bottom electrode structure (1102 of FIG. 11) and define a bottom electrode 208 and a bottom electrode via 524. An encapsulation layer 534 may be formed over the MTJ device 102 after its formation.

Figure 13:
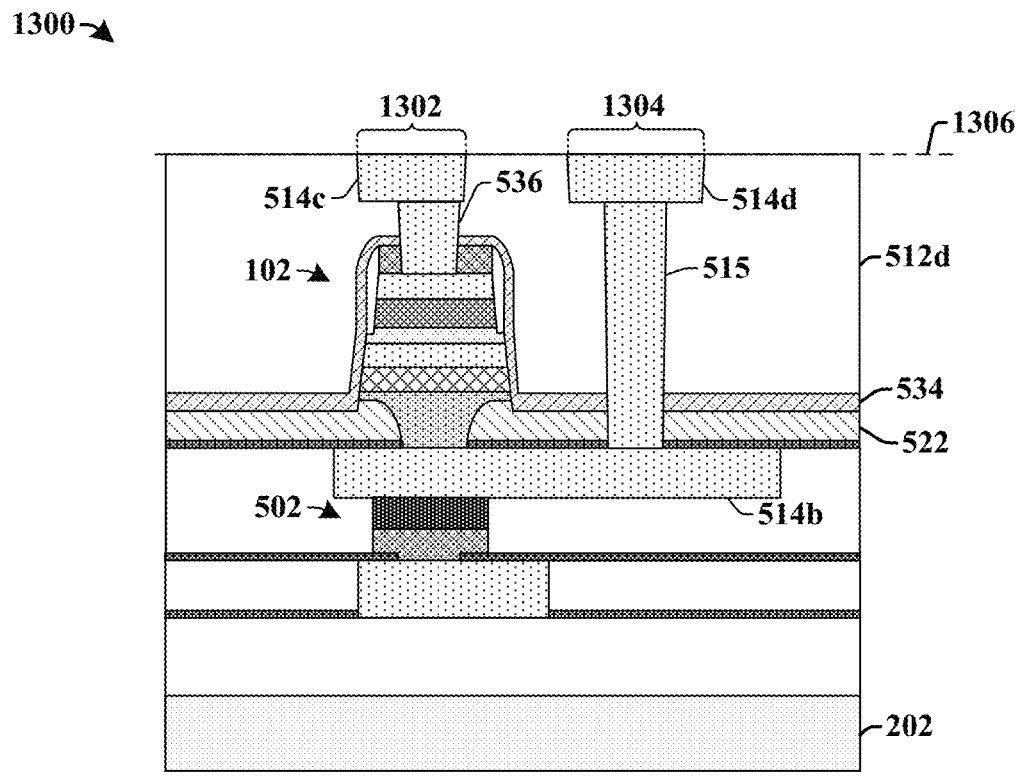

As shown in cross-sectional view 1300 of FIG. 13, a fourth ILD layer 512d is formed over the encapsulation layer 534. The fourth ILD layer 512d is patterned to define a first opening 1302 and a second opening 1304. The first opening 1302 extends from a top of the fourth ILD layer 512d to the top electrode 212. The second opening 1304 extends from the top of the fourth ILD layer 512d to the second interconnect wire 514b. The first opening 1302 and the second opening 1304 are subsequently filled with a conductive material followed by a planarization process (along line 1306). The conductive material within the first opening 1302 defines a top electrode via 536 contacting the top electrode 212 and a third interconnect wire 514c over the top electrode via 536. The conductive material within the second opening 1304 defines an interconnect via 515 and a fourth interconnect wire 514d over the interconnect via 515.

Figure 14A:
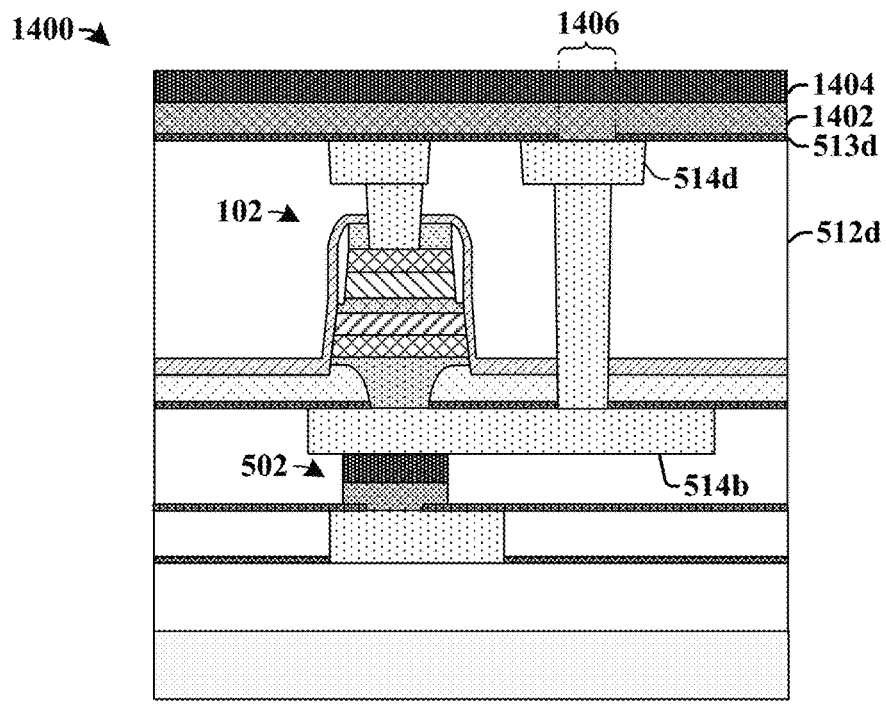
Figure 14B:
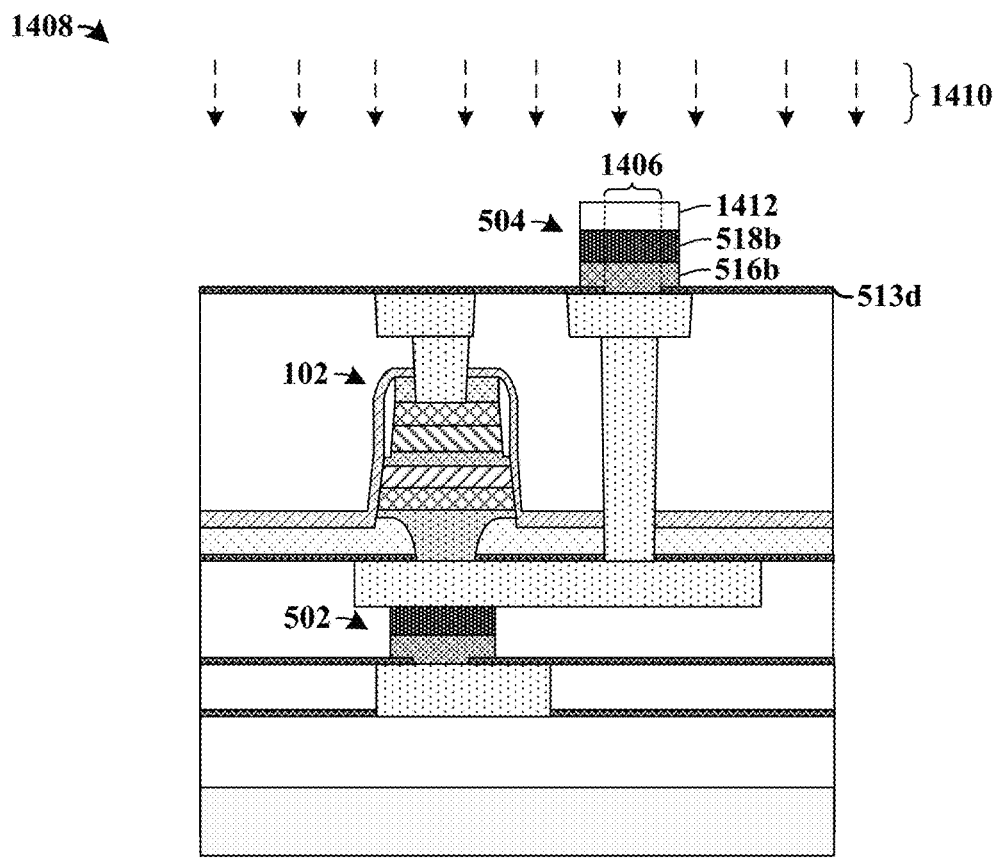

FIGS. 14A-14B illustrate some alternative embodiments of cross-sectional views showing the formation of a second diode 504 on the fourth interconnect wire 514d.

As shown in cross-sectional view 1400 of FIG. 14A, a fourth etch stop layer 513d is formed over the fourth ILD layer 512d. The fourth etch stop layer 513d may be formed by a deposition process. The fourth etch stop layer 513d is subsequently patterned to form a second opening 1406 over the fourth interconnect wire 514d.

A second layer of diode metal 1402 is formed over the fourth etch stop layer 513d and within the second opening 1406. The second layer of diode metal 1402 may be formed by a deposition process to a thickness of between approximately 10 nm and approximately 100 nm. A second layer of semiconductor material 1404 is formed onto the second layer of diode metal 1402. The second layer of semiconductor material 1404 may be formed by a deposition process to a thickness of between approximately 50 nm and approximately 150 nm. The second layer of semiconductor material 1404 forms a Schottky barrier at an interface between the second layer of semiconductor material 1404 and the second layer of diode metal 1402.

As shown in cross-sectional view 1408 of FIG. 14B, the second layer of diode metal (1402 of FIG. 14A) and the second layer of semiconductor material (1404 of FIG. 14A) are selectively patterned to define a second diode 504 comprising a Schottky diode having a second metal layer 516b and a second semiconductor layer 518b over the second metal layer 516b. In some embodiments, the second layer of diode metal (1402 of FIG. 14A) and the second layer of semiconductor material (1404 of FIG. 14A) are selectively exposed to an etchant 1410 in areas not covered by a third masking layer 1412. In some embodiments, the third masking layer 1412 may comprise photoresist or a hard mask (e.g., titanium, silicon nitride, or the like). The third masking layer 1412 is removed after patterning of the second diode 504.

Figure 15:
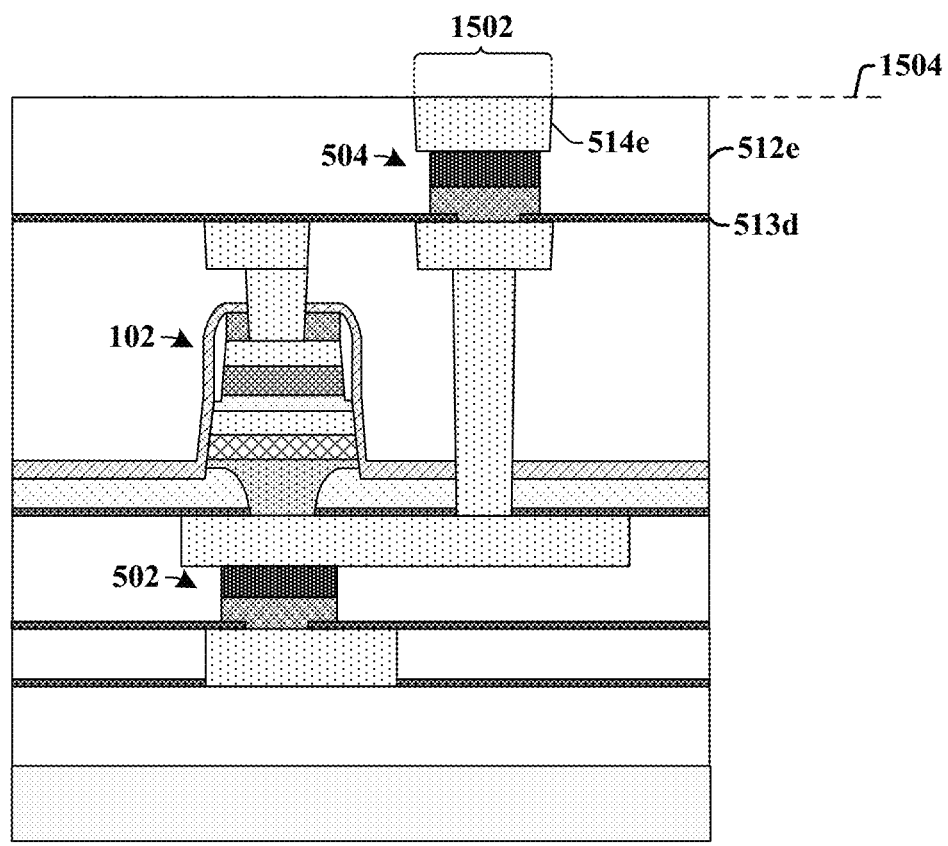

As shown in cross-sectional view 1500 of FIG. 15, a fifth ILD layer 512e is formed over the second diode 504. The fifth ILD layer 512e is patterned to define a trench 1502 overlying the second diode 504. The trench 1502 is filled with a conductive material followed by a planarization process (e.g., a chemical mechanical planarization process along line 1504) to remove conductive material from over the fifth ILD layer 512e. The planarization process defines a fifth interconnect wire 514e.

Figure 16:
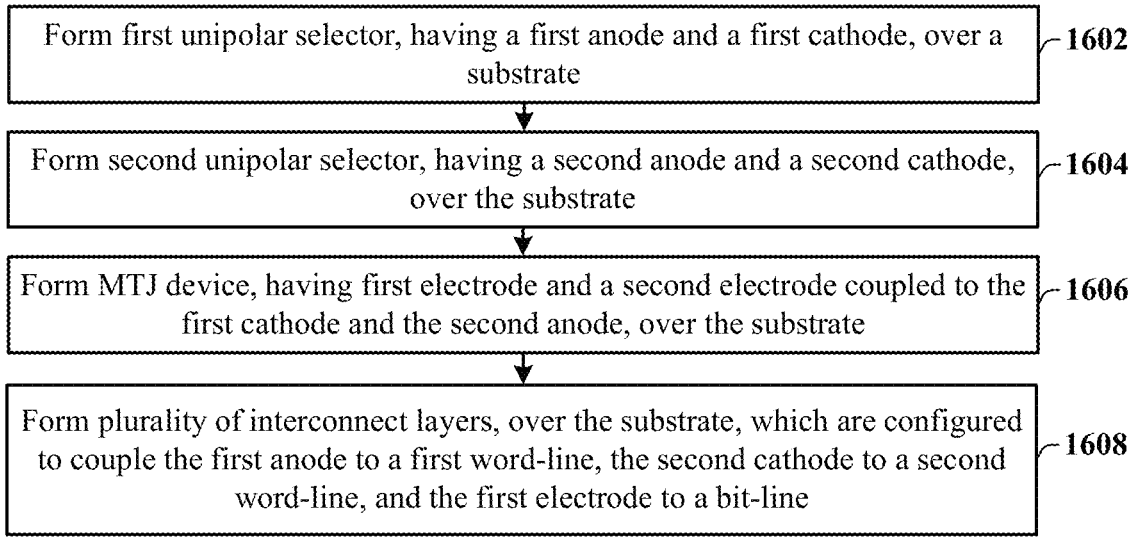
FIG. 16 illustrates a flow diagram of some embodiments of a method of forming an integrated chip having an access apparatus comprising a plurality of unipolar selectors configured to selectively provide access to an MTJ device.

FIG. 16 illustrates a flow diagram of some embodiments of a method 1600 of forming an integrated chip having a memory circuit comprising memory cells (e.g., MRAM cells) having an access apparatus comprising a plurality of unipolar selectors.

While method 1600 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1602, a first unipolar selector is formed over a substrate. The first unipolar selector has a first anode and a first cathode. FIGS. 8A-8C illustrate cross-sectional views, 800, 808, and 814, of some embodiments corresponding to act 1604. FIGS. 9A-9C illustrate cross-sectional views, 900, 906, and 912, of some alternative embodiments corresponding to act 1602.

At 1604, a second unipolar selector is formed over the substrate. In some embodiments, the second unipolar selector is separately fabricated (e.g., at different interconnect layers) from the first unipolar selector. Separately fabricating the first and second unipolar selectors allows for an area of a corresponding memory cell to be optimized and also allows for the first unipolar selector and the second unipolar selector to be easily fabricated as different types of unipolar selectors. FIGS. 14A-14B illustrate cross-sectional views, 1400 and 1408, of some embodiments corresponding to act 1604.

At 1606, a MTJ device is formed over the substrate. The MTJ device has a first electrode configured to be coupled to the first cathode and the second anode and a second electrode configured to be coupled to the first anode and the second cathode. FIGS. 11-12 illustrate cross-sectional views 1100-1200 of some embodiments corresponding to act 1606.

At 1608, a plurality of interconnect layers are formed over the substrate. The plurality of interconnect layers are configured to couple the first cathode to the second anode and/or to the first electrode. The plurality of interconnect layers are further configured to couple the first anode to a first word-line, the second cathode to a second word-line, and the second electrode to bit-line. In various embodiments, the plurality of interconnect layers may be formed before, after, or between formation of the first unipolar selector, the second unipolar selector, and the MTJ device. FIGS. 7, 10, 13, and 15 illustrate cross-sectional views, 700, 1000, 1300, and 1500, of some embodiments corresponding to act 1608.

Accordingly, in some embodiments, the present disclosure relates to an integrated chip comprising a memory cell having a magnetic tunnel junction (MTJ) device and an access apparatus comprising a plurality of unipolar selectors (i.e., devices that respectively pass current along a single direction during normal operation).

In some embodiments, the present disclosure relates to an integrated chip. The integrated chip includes a magnetic tunnel junction (MTJ) device disposed within a dielectric structure over a substrate, the MTJ device having a MTJ disposed between a first electrode and a second electrode; a first unipolar selector disposed within the dielectric structure and coupled to the first electrode, the first unipolar selector configured to allow current to flow through the MTJ device along a first direction; and a second unipolar selector disposed within the dielectric structure and coupled to the first electrode, the second unipolar selector configured to allow current to flow through the MTJ device along a second direction opposite the first direction. In some embodiments, the first unipolar selector is a first diode and the second unipolar selector is a second diode. In some embodiments, the first unipolar selector is coupled between a first word line and the first electrode of the MTJ device; the second unipolar selector is coupled between a second word line and the first electrode of the MTJ device; and the second electrode of the MTJ device is coupled to a bit-line. In some embodiments, the first unipolar selector laterally extends between a first vertical line intersecting the MTJ device and the substrate and a second vertical line intersecting the second unipolar selector and the substrate. In some embodiments, the first unipolar selector is arranged vertically below the MTJ device and the second unipolar selector is arranged vertically above the MTJ device. In some embodiments, the first unipolar selector includes a first metal layer and a first semiconductor layer, the first semiconductor layer disposed between the first metal layer and the MTJ device along a first conductive path; and the second unipolar selector includes a second semiconductor layer and a second metal layer, the second metal layer disposed between the second semiconductor layer and the MTJ device along a second conductive path. In some embodiments, the integrated chip further includes an additional metal layer disposed between a top of the first unipolar selector and a bottom of the MTJ device, the additional metal layer having a first width that decreases as a distance from the substrate increases and the first unipolar selector having a second width that decreases as a distance from the substrate increases. In some embodiments, the integrated chip further includes an interconnect via disposed within the substrate at a position that is laterally separated from the additional metal layer, a horizontal plane that is parallel to an upper surface of the substrate extending along a top surface of the additional metal layer and through a sidewall of the interconnect via. In some embodiments, the integrated chip further includes an interconnect via laterally separated from the MTJ device and having a bottom that contacts an upper surface of the additional metal layer and a top that is coupled to the second unipolar selector. In some embodiments, the integrated chip further includes an interconnect wire disposed between a top of the first unipolar selector and a bottom of the MTJ device, the interconnect wire extending along sidewalls of the first unipolar selector. In some embodiments, the first unipolar selector has a first width and the second unipolar selector has a second width that is less than the first width. In some embodiments, the first unipolar selector is configured to pass current through the MTJ device along a direction that facilitates a parallel to anti-parallel transition. In some embodiments, the first unipolar selector has an uppermost surface that continuously extends from directly below the MTJ device to directly below the second unipolar selector.

In other embodiments, the present disclosure relates to an integrated circuit chip. The integrated chip includes a magnetic tunnel junction (MTJ) device having a first electrode coupled to a bit line and a second electrode; and an access apparatus coupled to the second electrode and having a plurality of unipolar selectors respectively configured to pass current through the MTJ device along a single direction, the plurality of unipolar selectors are collectively configured to pass currents through the MTJ device along opposing directions. In some embodiments, the access apparatus includes a first unipolar selector coupled between a first word line and the first electrode of the MTJ device; and a second unipolar selector coupled between a second word line and the first electrode of the MTJ device. In some embodiments, the access apparatus includes a first unipolar selector having a first cathode terminal coupled to the first electrode; and a second unipolar selector having a second anode terminal coupled to the first electrode. In some embodiments, the access apparatus includes a first unipolar selector having a first cathode terminal coupled to the first electrode and a first anode terminal coupled to a first word line; and a second unipolar selector having a second anode terminal coupled to the first electrode and a second cathode terminal coupled to a second word line. In some embodiments, the integrated chip further includes a control circuit configured to operate a word line decoder to concurrently apply a first non-zero bias voltage to a plurality of word lines coupled to the access apparatus during a write operation that writes a data state to the MTJ device.

In yet other embodiments, the present disclosure relates to a method of forming an integrated chip. The method includes forming a magnetic tunnel junction (MTJ) device over a semiconductor substrate, the MTJ device having a MTJ disposed between a first electrode and a second electrode; forming a first unipolar selector over the semiconductor substrate, the first unipolar selector configured to be coupled to the first electrode and to allow current to flow through the MTJ device along a first direction; and forming a second unipolar selector over the semiconductor substrate, the second unipolar selector configured to be coupled to the first electrode and to allow current to flow through the MTJ device along a second direction opposing the first direction. In some embodiments, the method further includes forming the MTJ device directly over or directly under a first interconnect wire, the first unipolar selector is formed to have a first anode terminal configured to be coupled to the first interconnect wire and the second unipolar selector is formed to have a second cathode terminal configured to be coupled to the first interconnect wire.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. An integrated chip, comprising:
a magnetic tunnel junction (MTJ) device disposed within a dielectric structure over a substrate, the MTJ device having a MTJ disposed between a first electrode and a second electrode;
a first unipolar selector disposed within the dielectric structure and coupled to the first electrode, wherein the first unipolar selector is configured to allow current to flow through the MTJ device along a first direction;

a second unipolar selector disposed within the dielectric structure and coupled to the first electrode, wherein the second unipolar selector is configured to allow current to flow through the MTJ device along a second direction opposite the first direction; and wherein the first unipolar selector and the second unipolar selector are arranged at different distances over the substrate.

2. The integrated chip of claim 1, wherein the first unipolar selector is a first diode and the second unipolar selector is a second diode.

3. The integrated chip of claim 1,
wherein the first unipolar selector is coupled between a first word line and the first electrode of the MTJ device;
wherein the second unipolar selector is coupled between a second word line and the first electrode of the MTJ device; and
wherein the second electrode of the MTJ device is coupled to a bit-line.

4. The integrated chip of claim 1, wherein the first unipolar selector laterally extends between a first vertical line intersecting the MTJ device and the substrate and a second vertical line intersecting the second unipolar selector and the substrate.

5. The integrated chip of claim 1, wherein the first unipolar selector is arranged vertically below the MTJ device and the second unipolar selector is arranged vertically above the MTJ device.

6. The integrated chip of claim 1,
wherein the first unipolar selector comprises a first metal layer and a first semiconductor layer, the first semiconductor layer disposed between the first metal layer and the MTJ device along a first conductive path; and
wherein the second unipolar selector comprises a second semiconductor layer and a second metal layer, the second metal layer disposed between the second semiconductor layer and the MTJ device along a second conductive path.

7. The integrated chip of claim 1, further comprising:
an additional metal layer disposed between a top of the first unipolar selector and a bottom of the MTJ device, wherein the additional metal layer has a first width that decreases as a distance from the substrate increases and wherein the first unipolar selector has a second width that decreases as a distance from the substrate increases.

8. The integrated chip of claim 7, further comprising:
an interconnect via disposed within the dielectric structure at a position that is laterally separated from the additional metal layer, wherein a horizontal plane that is parallel to an upper surface of the substrate extends along a top surface of the additional metal layer and through a sidewall of the interconnect via.

9. The integrated chip of claim 7, further comprising:
an interconnect via laterally separated from the MTJ device and having a bottom that contacts an upper surface of the additional metal layer and a top that is coupled to the second unipolar selector.

10. The integrated chip of claim 1, further comprising:
an interconnect wire disposed between a top of the first unipolar selector and a bottom of the MTJ device, wherein the interconnect wire extends along sidewalls of the first unipolar selector.

11. The integrated chip of claim 1, wherein the first unipolar selector has a first width and the second unipolar selector has a second width that is less than the first width.

12. The integrated chip of claim 11, wherein the first unipolar selector is configured to pass current through the MTJ device along a direction that facilitates a parallel to anti-parallel transition.

13. An integrated chip, comprising:
a first unipolar selector disposed within a dielectric structure between a first interconnect and a second interconnect that is over the first interconnect, wherein the second interconnect extends along one or more sidewalls of the first unipolar selector;
a magnetic tunnel junction (MTJ) device disposed within the dielectric structure between the second interconnect and a third interconnect that is over the second interconnect, wherein the first unipolar selector is configured to allow a first current to flow from the second interconnect to the MTJ device; and
a second unipolar selector disposed within the dielectric structure between the second interconnect and a fourth interconnect over the second interconnect, wherein the second unipolar selector is configured to allow a second current to flow from the MTJ device to the fourth interconnect.

14. The integrated chip of claim 13, wherein the first unipolar selector is configured to pass the first current through the MTJ device along a first direction and the second unipolar selector is configured to pass the second current through the MTJ device along a second direction that is opposite the first direction.

15. The integrated chip of claim 13,
wherein the first unipolar selector is coupled between a first word line and a first electrode of the MTJ device; and
wherein the second unipolar selector is coupled between a second word line and the first electrode of the MTJ device.

16. The integrated chip of claim 13, wherein the first unipolar selector is arranged vertically below the MTJ device and the second unipolar selector is arranged vertically above the MTJ device.

17. The integrated chip of claim 13, wherein the MTJ device is coupled to a first point along an upper surface of the second interconnect and the second unipolar selector is coupled to a second point along the upper surface of the second interconnect that is laterally offset from the first point.

18. An integrated chip, comprising:
a magnetic tunnel junction (MTJ) device disposed within a dielectric structure over a substrate, the MTJ device having a MTJ disposed between a first electrode and a second electrode;
a first unipolar selector disposed within the dielectric structure and coupled to the first electrode, wherein the first unipolar selector is configured to allow current to flow through the MTJ device along a first direction;
a second unipolar selector disposed within the dielectric structure and coupled to the first electrode, wherein the second unipolar selector is configured to allow current to flow through the MTJ device along a second direction opposite the first direction; and
wherein the first unipolar selector has an uppermost surface that continuously extends from directly below the MTJ device to directly below the second unipolar selector.

19. The integrated chip of claim 18, wherein the MTJ device is disposed vertically above the first unipolar selector and the second unipolar selector is disposed vertically above the MTJ device.

20. The integrated chip of claim 18, wherein the first unipolar selector has a different width than the second unipolar selector.

* * * * *